United States Patent [19]
Ohki et al.

[11] Patent Number: 5,886,408
[45] Date of Patent: Mar. 23, 1999

[54] MULTI-CHIP SEMICONDUCTOR DEVICE

[75] Inventors: Ken'ichi Ohki; Kiyoshi Muratake; Hidetoshi Inoue; Takehisa Tsujimura, all of Kawasaki, Japan

[73] Assignee: Fujitsu Limited, Kawasaki, Japan

[21] Appl. No.: 808,811

[22] Filed: Feb. 28, 1997

Related U.S. Application Data

[62] Division of Ser. No. 520,647, Aug. 29, 1995, abandoned.

[30] Foreign Application Priority Data

Sep. 8, 1994 [JP] Japan .................................. 6-215059
Sep. 19, 1994 [JP] Japan .................................. 6-223810

[51] Int. Cl.$^6$ .......................... H01L 23/06; H01L 23/10; H01L 23/34; H01L 23/28
[52] U.S. Cl. .......................... 257/720; 257/705; 257/706; 257/707; 257/712; 257/796
[58] Field of Search .................................. 257/705, 706, 257/707, 712, 720, 796

[56] References Cited

U.S. PATENT DOCUMENTS

| | | | |
|---|---|---|---|
| 4,531,146 | 7/1985 | Cutchaw | 257/713 |
| 4,612,601 | 9/1986 | Watari | 361/387 |
| 4,612,978 | 9/1986 | Cutchaw | 165/104.33 |
| 4,644,385 | 2/1987 | Nakanishi et al. | 257/713 |
| 4,878,108 | 10/1989 | Phelps, Jr. et al. | 257/796 |
| 5,089,936 | 2/1992 | Kojima et al. | 361/705 |
| 5,175,613 | 12/1992 | Barker, III et al. | 257/713 |
| 5,184,211 | 2/1993 | Fox | 257/706 |
| 5,345,107 | 9/1994 | Daikoku et al. | 257/717 |

FOREIGN PATENT DOCUMENTS 59-65457  4/1984  Japan .

*Primary Examiner*—Teresa M. Arroyo
*Attorney, Agent, or Firm*—Armstrong, Westerman, Hattori, McLeland & Naughton

[57] ABSTRACT

A semiconductor device including: a ceramic base board formed of A1N; a CPU chip and a CMU chip which are flip-chip bonded on a circuit board which includes the ceramic base board; SRAM chips which are die-bonded to the lower major surface of the circuit board; first heat conductive blocks adhesively attached to the CPU chip and the CMU chip; second heat conductive blocks adhesively attached to the upper major surface of the A1N ceramic base board; a resin package; and a heat sink which, adhesively attached on the upper major surface of the resin package, is in close contact with the first heat conductive blocks and the second heat conductive blocks. The heat generated by the CPU chip and the CMU chip is transferred to the heat sink via the first heat conductive blocks and is radiated from the heat sink. The heat generated by the SRAM chips is transferred to the heat sink via the A1N ceramic base board and the second heat conductive blocks and is radiated from the heat sink.

6 Claims, 21 Drawing Sheets

PROCESS 70

PROCESS 71

PROCESS 72

PROCESS 73

PROCESS 74

PROCESS 75

MULTI-CHIP SEMICONDUCTOR DEVICE

This is divisional of application Ser. No. 08/520,647 filed Aug. 29, 1995, now abandoned.

BACKGROUND OF THE INVENTION

1. Field of the Invention

The present invention generally relates to semiconductor devices and methods of producing the same, and more particularly to a multi-chip module in which a plurality of semiconductor chips are mounted on the upper major surface of a wiring circuit board, and to a method of producing the same. A more specific application of the present invention is to a multi-chip module in which a plurality of semiconductor chips are mounted both on the upper major surface of a wiring circuit board and on the lower major surface thereof, and to a method of producing the same. The present invention concerns the radiating structure of a multi-chip module (multi-chip semiconductor device).

Recently, there has been a demand for rapid signal processing in the field of computer technology. In order to meet this demand, a method by which a multi-chip module is produced and mounted on a mounting base board (motherboard) is employed. A multi-chip module is a module in which a plurality of related semiconductor chips constituting a system, instead of a single semiconductor chip, are mounted on a thin-film multi-layer wiring circuit board.

As individual semiconductor chips become highly integrated, the power consumption and the amount of heat radiated from individual chips tends to increase.

Hence, a semiconductor device having a structure capable of radiating heat efficiently is demanded.

2. Description of the Related Art

Generally, the great capability of a semiconductor device called a multi-chip module is derived from its construction in which a plurality of semiconductor chips are mounted on a single circuit board. Conventionally, in such a semiconductor device, the wiring circuit board and the semiconductor chips are not hermetically sealed in a package. The heat generated by the semiconductor chips is wasted in the environment by radiation or transferred via a gap between the circuit board and a cap adhesively attached to the circuit board to cover the semiconductor chips.

Recently, semiconductor devices having radiating fins adhesively attached to the upper major surface of a cap have been provided. In such semiconductor devices, the heat transferred to the cap through the gap is radiated using the radiating fins. Conventionally, the radiating fins are fixed to the upper major surface of the cap by an adhesive.

One example of the related art is a multi-chip module 10 shown in FIG. 1. The multi-chip module 10 is disclosed in the Japanese Patent Application No. 5-205444 filed by the applicants of the present invention.

The multi-chip module 10 includes a thin-film multi-layer circuit board 311, semiconductor chips $312_{-1}$ and $312_{-2}$, heat conductive blocks $313_{-1}$ and $313_{-2}$, a resin package 314, a heat sink 315 and leads 316.

As indicated by arrows 317, the heat generated by the semiconductor chips $312_{-1}$ and $312_{-2}$ is transferred to the heat sink 315 via the heat conductive blocks $313_{-1}$ and $313_{-2}$. The heat is then radiated to the surrounding atmosphere from the heat sink 315.

The thin-film multi-layer circuit board 311 comprises a ceramic circuit board 318 formed of $Al_2O_3$ and a thin-film multi-layer wiring layer 319 provided on the ceramic circuit board 318.

A semiconductor device configured to have radiating fins adhesively attached to the upper major surface of the cap is heat-treated in order to harden the adhesive used to attach the radiating fins. As a consequence of this heat treatment, a thermal stress at a joint between the wiring circuit board and the semiconductor chips is generated. The residual thermal stress may create a crack in the wiring circuit board or the semiconductor chips.

Further, even in the structure in which the heat radiating fins are employed, a gap formed between the cap and the circuit board serves as a heat transfer passage. Hence, an inefficient heat radiating efficiency results.

In the conventional semiconductor device, the cap is fixed to the wiring circuit board by an adhesive or attached to a base member provided underneath the wiring circuit board. This arrangement has a disadvantage in that it is impossible to remove a cap once it is fixed in place adhesively. Therefore, the problem of poor maintainability is encountered when, for example, any of the semiconductor chips fails.

In order to increase the density with which the semiconductor chips are mounted, a thin-film multi-layer circuit board of a multi-chip module may be configured such that the thin-film wiring layer is provided on the lower major surface of a ceramic circuit board as well as on the upper major surface thereof so that the semiconductor chips are mounted on the underside of the thin-film multi-layer circuit board as well as on the topside thereof.

However, the semiconductor device having the above construction has a disadvantage in that the heat generated by the semiconductor chips mounted on the underside of the thin-film circuit board is not radiated efficiently.

SUMMARY OF THE INVENTION

Accordingly, it is an object of the present invention to provide a multi-chip semiconductor device and a method of producing the same in which the aforementioned disadvantages are eliminated.

Another and more specific object of the present invention is to provide a multi-chip semiconductor device and a method of producing the same in which the heat radiating efficiency and the maintainability are improved.

In order to achieve the aforementioned objects, the present invention provides a semiconductor device comprising: a wiring circuit board having semiconductor chips mounted on its upper major surface and connection terminals formed on its lower major surface; a cap formed above the upper major surface of the wiring circuit board so as to be integral with radiating fins and encapsulate the semiconductor chips; a base member engaged with the underside of the wiring circuit board; and a screw coupling mechanism for fixing the cap and the base member to each other, wherein the cap comes into contact with the semiconductor chips directly or indirectly via a material having a high heat conductivity, and the cap and the base member encapsulate the semiconductor chips by sandwiching the wiring circuit board.

According to the semiconductor device of the present invention, the heat generated by the semiconductor chips is directly conducted to the cap so as to be radiated from the radiating fins. Therefore, the cooling of the semiconductor chips can be performed efficiently. The screw coupling mechanism makes it possible to detach the cap and the base member from each other. Since the wiring circuit board is simply sandwiched between the cap and the base member, the package constituted of the cap and the base member can be easily detached from the wiring circuit board by operating the screw coupling mechanism to disengage the cap and the base member from each other. Hence, the satisfactory maintainability is realized. The construction in which the cap is indirectly in contact with the semiconductor chips via a material having a high heat conductivity ensures that the heat radiation of the semiconductor chips can be performed efficiently.

In one preferred embodiment of the present invention, connection terminals are connected to external devices via an opening formed in the base member, thus making the surface mounting of the semiconductor device easy to perform.

In another preferred embodiment of the present invention, connection terminals are embodied by pins or bumps formed of a conductive metal. Therefore, it is possible to produce a semiconductor device having a large number of terminals.

The screw coupling mechanism may be constructed inexpensively by using screws and nuts that are generally available.

In another preferred embodiment, notches are formed at the corners of the wiring circuit board, and the screw coupling mechanism is provided in each of the corners of the cap and the base member. In this construction, dead space created at the corners of the wiring circuit board, the cap and the base member can be utilized positively. Thus, the semiconductor device can be made more compact.

In still another preferred embodiment, a packing member provided between the cap and the semiconductor chips functions as a shock absorber. Therefore, even when the cap directly contacts the semiconductor chips, the stress is prevented from remaining between the cap and the semiconductor chips.

In yet another preferred embodiment, at least one of the cap and the base member is provided with a guide at its surface facing the wiring circuit board so as to project from the surface, and wherein the wiring circuit board is disposed inside of the guide. According to this construction, the wiring circuit board is placed in a space surrounded by the guide. Hence, it is possible to hold the wiring circuit board firmly. Further, the operation of assembling the cap to the base member and the operation of building the wiring circuit board into the package are made easy.

The present invention also provides a method of producing a semiconductor device comprising the steps of: a) mounting semiconductor chips on the upper major surface of a wiring circuit board; b) accommodating a packing member in a groove provided in a cap in which a plurality of radiating fins and a cavity are formed; c) attaching the cap to the wiring circuit board and attaching a base member to the underside of the wiring circuit board; and d) fixing the cap and the base member to each other using a screw coupling mechanism. According to the method of the present invention, it is possible to provide a semiconductor device having a satisfactory cooling efficiency.

The present invention also provides a semiconductor device comprising: a ceramic base board having a higher heat conductivity than a normal ceramic base board; an upper group of semiconductor chips mounted on the upper major surface of the ceramic base board by flip-chip bonding; heat conductive blocks of a first type which, formed of a material having a high heat conductivity, are attached to the upper group of semiconductor chips; second heat conductive blocks which, formed of a material having a high heat conductivity, are attached to the upper major surface of the ceramic base board; a lower group of semiconductor chips mounted on the lower major surface of the ceramic base board by die-bonding; a resin package for encapsulating the ceramic base board, the upper group of semiconductor chips, the heat conductive blocks of a first type, the second heat conductive blocks and the lower group of semiconductor chips; leads which extend from the resin package and are bonded to a circuit board when the semiconductor device is mounted on the circuit board; and a heat sink attached to the upper major surface of the resin package after lapping the upper major surface of the resin package so as to expose the heat conductive blocks of a first type and the second heat conductive blocks. In this construction, the ceramic base board and the heat conductive blocks of a second type constitute a passage for allowing the heat generated by the lower group of semiconductor chips to escape to the heat sink. The heat conductive blocks of a first type constitute a passage for allowing the heat generated by the upper group of semiconductor chips to escape to the heat sink. According to this aspect of the present invention, it is possible to radiate not only the heat generated by the upper group of semiconductor chips but also the heat generated by the lower group of semiconductor chips efficiently.

Alternatively, the second heat conductive blocks are columns attached near the corners of the ceramic base board. This construction ensures that the second heat conductive blocks is directly in contact with the base board without an insulating layer intervening. According to this aspect of the present invention, the thermal resistance between the base board and the columnar second heat conductive blocks is reduced, thereby making it possible to cool the lower group of semiconductor chips efficiently.

Alternatively, the second heat conductive blocks are blocks having a rectangular cross section attached to the ceramic base board so as to surround the upper group of semiconductor chips. In this construction, the second heat conductive blocks provides a large cross-sectional area in a passage of heat. According to this aspect of the present invention, it is possible to cool the lower group of semiconductor chips efficiently.

The present invention also provides a semiconductor device comprising: a ceramic base board having a higher heat conductivity than a normal ceramic base board; an upper group of semiconductor chips mounted on the upper major surface of the ceramic base board by flip-chip bonding; heat conductive blocks of a first type which, formed of a material having a high heat conductivity, are attached to the upper group of semiconductor chips; a lower group of semiconductor chips mounted on the lower major surface of the ceramic base board by flip-chip bonding; heat conductive blocks of a third type which, formed of a material having a high heat conductivity, are attached to the lower major surface of the lower group of semiconductor chips; a resin package for encapsulating the ceramic base board, the upper group of semiconductor chips, the heat conductive blocks of a first type, the lower group of semiconductor chips and the heat conductive blocks of a third type; leads which extend from the resin package and are bonded to a circuit board when the semiconductor device is mounted on the circuit board; a heat sink attached to the upper major surface of the resin package after lapping the upper major surface of the resin package so as to expose the heat conductive blocks of a first type; and a heat conductive plate attached to the lower major surface of the resin package after the heat conductive blocks of a third type are exposed by lapping the lower major surface of the resin package, the heat conductive plate being bonded to a circuit board when the semiconductor device is mounted on the circuit board. In this construction, the heat conductive blocks of a third type and the heat conductive plate constitute a passage for allowing the heat generated by the lower group of semiconductor chips to escape to the motherboard.

The present invention also provides a semiconductor device comprising: a ceramic base board having a higher heat conductivity than a normal ceramic base board; an upper group of semiconductor chips mounted on the upper major surface of the ceramic base board by flip-chip bonding; heat conductive blocks of a first type which, formed of a material having a high heat conductivity, are attached to the upper group of semiconductor chips; heat conductive blocks of a second type which, formed of a material having a high heat conductivity, are attached to the upper major surface of the ceramic base board; a lower group of semiconductor chips mounted on the lower major surface of the ceramic base board by die-bonding; heat conductive blocks of a fourth type which, formed of a material having a high heat conductivity, are attached to the lower major surface of the ceramic base board; a resin package for encapsulating the ceramic base board, the upper group of semiconductor chips, the heat conductive blocks of a first type, the heat conductive blocks of a second type; the lower group of semiconductor chips and the heat conductive blocks of a fourth type; leads which extend from the resin package and are bonded to a circuit board when the semiconductor device is mounted on the circuit board; a heat sink attached to the upper major surface of the resin package after lapping the upper major surface of the resin package so as to expose the heat conductive blocks of a first type and the heat conductive blocks of a second type; and a heat conductive plate attached to the lower major surface of the resin package after the heat conductive blocks of a fourth type are exposed by lapping the lower major surface of the resin package, the heat conductive plate being bonded to a circuit board when the semiconductor device is mounted on the circuit board. In this construction, the heat ceramic base board and the heat conductive blocks of a second type constitute a passage for allowing the heat generated by the lower group of semiconductor chips to escape to the heat sink. The ceramic base board, the heat conductive blocks of a third type and the heat conductive plate constitute a passage for allowing the heat generated by the lower group of semiconductor chips to escape to the motherboard. In this way, the lower group of semiconductor chips can be cooled efficiently.

The present invention also provides a semiconductor device comprising: a ceramic base board having a higher heat conductivity than a normal ceramic base board; an upper group of semiconductor chips mounted on the upper major surface of the ceramic base board by flip-chip bonding; heat conductive blocks of a second type which, formed of a material having a high heat conductivity, are attached to the upper major surface of the ceramic base board; a lower group of semiconductor chips mounted on the lower major surface of the ceramic base board by die-bonding; a resin package for encapsulating the ceramic base board, the upper group of semiconductor chips, the heat conductive blocks of a second type and the lower group of semiconductor chips; leads which extend from the resin package and are bonded to a circuit board when the semiconductor device is mounted on the circuit board; and a heat sink attached to the upper major surface of the resin package after lapping the upper major surface of the resin package so as to expose the heat conductive blocks of a second type. In this construction, the ceramic base board and the heat conductive blocks of a second type constitute a passage for allowing the heat generated by the upper group of semiconductor chips and the lower group of semiconductor chips to escape to the heat sink. This aspect of the present invention is particularly useful to cool the upper group of semiconductor chips and the lower group of semiconductor chips which are both die-bonded to the circuit board.

The present invention also provides a method of producing a semiconductor device comprising the steps of: a) mounting semiconductor chips on the upper major surface and the lower major surface of a circuit board including a ceramic base board having a higher heat conductivity than a normal ceramic base board; b) attaching upper heat conductive blocks either on the upper major surface of an upper group of semiconductor chips mounted on the circuit board or on the upper major surface of the ceramic base board or on both; c) forming a resin package for encapsulating the circuit board, the upper group of semiconductor chips, the upper heat conductive blocks and a lower group of semiconductor chips mounted on the lower major surface of the circuit board; d) lapping the upper major surface of the resin package formed in the step c) so as to expose the upper heat conductive blocks; and e) attaching a heat sink to the lapped upper major surface of the resin package. The lapping step included in the above-described method ensures that the heat sink is in close contact with the heat conductive blocks, thus improving the cooling efficiency of the multi-chip module.

The present invention also provides a method of producing a semiconductor device comprising the steps of: a) mounting semiconductor chips on the upper major surface and the lower major surface of a circuit board including a ceramic base board having a higher heat conductivity than a normal ceramic base board; b) attaching upper heat conductive blocks either on the upper major surface of an upper group of semiconductor chips mounted on the circuit board or on the upper major surface of the ceramic base board or on both, and attaching lower heat conductive blocks either on the lower major surface of a lower group of semiconductor chips or on the lower major surface of the circuit board or on both; c) forming a resin package for encapsulating the circuit board, the upper group of semiconductor chips, the upper heat conductive blocks, the lower group of semiconductor chips mounted on the lower major surface of the circuit board and the lower heat conductive blocks; d) lapping the upper major surface of the resin package formed in the step c) so as to expose the upper heat conductive blocks, and lapping the lower major surface of the resin package so as to expose the lower heat conductive blocks; and e) attaching a heat sink to the lapped upper major surface of the resin package, and attaching, to the lapped lower major surface of the resin package, a heat conductive plate which dissipates the heat and transfers the heat to a motherboard on which the semiconductor device is mounted. The lapping step included in the above-described method ensures that the heat sink and the heat conductive plate are in close contact with the heat conductive blocks, thus improving the cooling efficiency of the multi-chip module.

BRIEF DESCRIPTION OF THE DRAWINGS

Other objects and further features of the present invention will be apparent from the following detailed description when read in conjunction with the accompanying drawings, in which.

DESCRIPTION OF THE PREFERRED EMBODIMENTS

Figure 1:
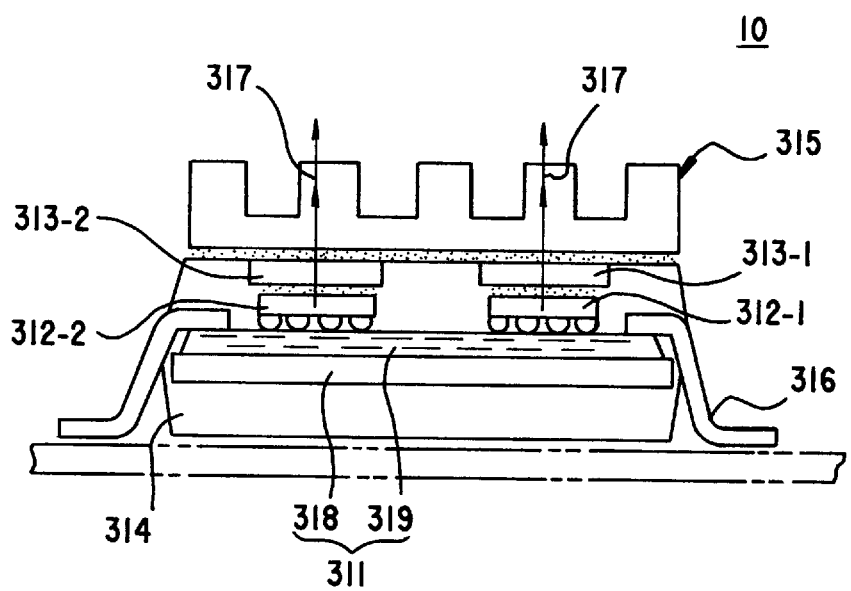
FIG. 1 illustrates a multi-chip module disclosed in a related application filed by the applicants.
Figure 2A:
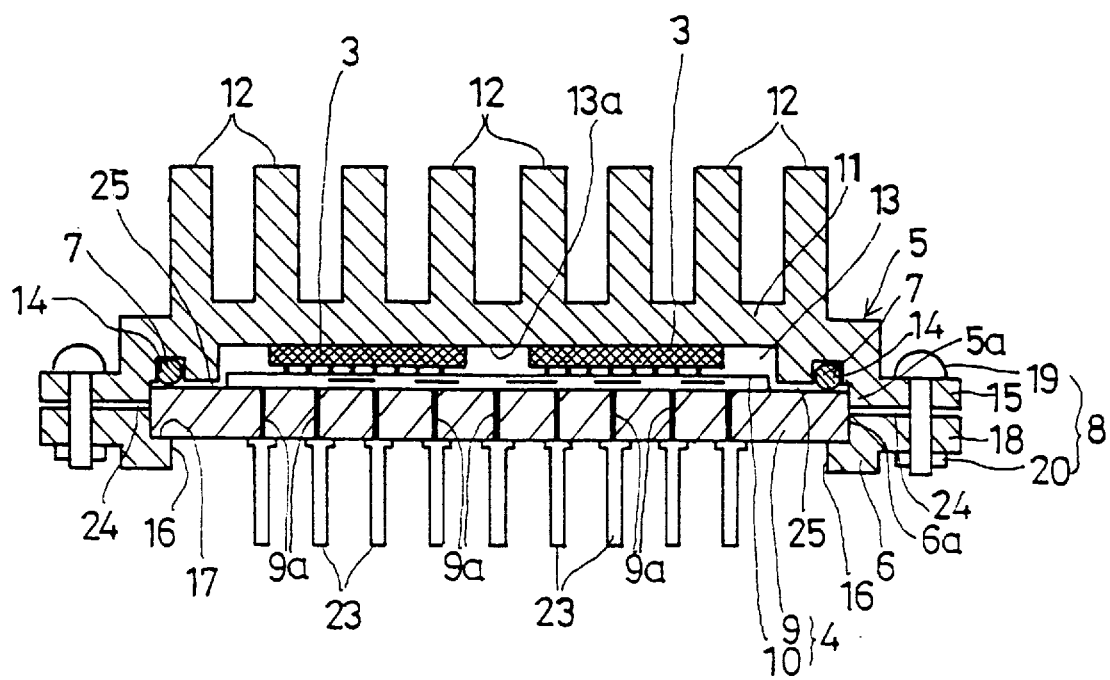
FIG. 2A is a cross-sectional view showing a semiconductor device according to a first embodiment of the present invention.
Figure 2B:
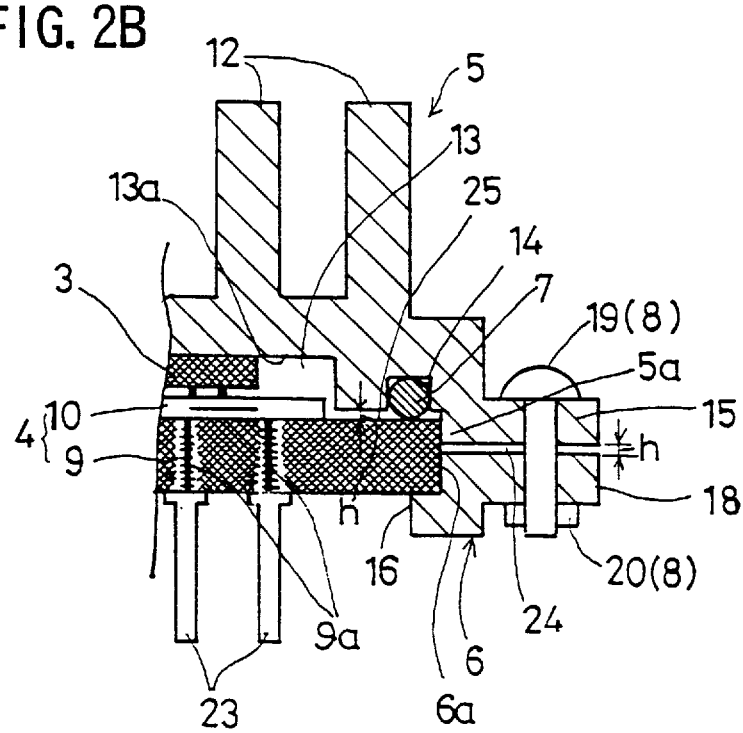
FIG. 2B is an enlarged cross-sectional view of a portion of FIG. 2A.
Figure 3:
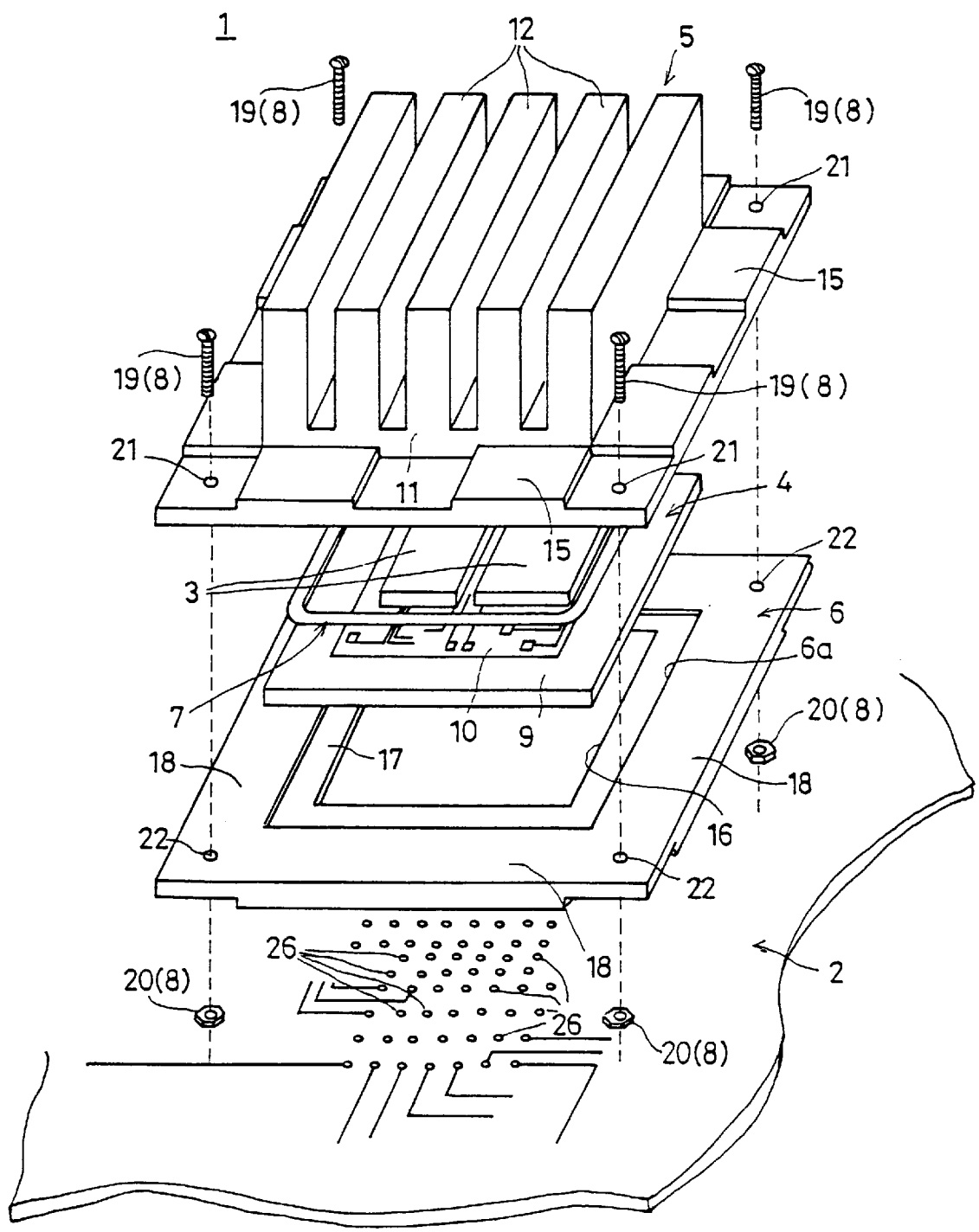
FIG. 3 is an exploded perspective view which explains how the semiconductor device according to the first embodiment is mounted on a mounting base board.

FIGS. 2A, 2B and 3 show a semiconductor device 1 according to a first embodiment of the present invention. FIGS. 2A and 2B are cross-sectional views of the semiconductor device 1, and FIG. 3 is an exploded perspective view showing how the semiconductor device 1 is mounted on a mounting base board 2.

The semiconductor device 1 is a multi-chip module and generally comprises semiconductor chips 3, a wiring circuit board 4, a cap 5, a base member 6, a packing member 7 and a screw coupling mechanism 8.

It is assumed that the semiconductor chips 3 are highly integrated and are known to have a high power consumption and radiate a large amount of heat. The semiconductor chips 3 are mounted on the upper major surface of the wiring circuit board 4 by face-down bonding. The wiring circuit board 4 is composed of a base board 9 and a thin-film circuit part 10 formed on the base board 9.

In the first embodiment, the flip-chip bonding in which solder bumps are formed on the underside of the semiconductor chips 3 and the solder bumps are directly connected to the thin-film circuit part 10 is employed. The semiconductor chips 3 may also be connected to the wiring circuit board 4 by the tape automated bonding (TAB) method.

The thin-film circuit part 10 is configured such that a plurality of wiring layers and a plurality of insulation layers are built on each other alternatively, via holes or the like connecting the wiring layers. The semiconductor chips 3 are connected to the topmost layer, and vias 9a formed in the base board 9 are connected to the lowermost layer. Lower ends of the vias 9a formed in the base board 9 are provided with connection pins 23 formed of a conductive metal. The connection pins 23, which serve as terminals for connection to external devices, are soldered to the base board 9 so as to be electrically connected to the respective vias 9a.

The cap 5 is formed of a metal such as aluminum having a satisfactory heat conductivity and configured such that a cap part 11 and radiating fins 12 are integrally constructed. A recess formed in the cap part 11 to face the chips 3 constitutes a cavity 13. The semiconductor chips 3 are provided so as to be accommodated in the cavity 13.

The plurality of radiating fins 12 are formed to extend upward from the cap part 11 and increase the heat radiating effect by coming into contact with air extensively. An accommodating groove 14 is provided outside of the cavity 13 of the cap 5 so as to surround the entirety of the cavity 13 and accommodate the packing member 7. A flange 15 is provided at the periphery of the cap 5. A guide part 5a for guiding the wiring circuit board 4 by being engaged with the periphery of the wiring circuit board 4 is formed in the flange 15 to face the interior of the device.

Like the cap 5, the base member 6 is formed of a metal such as aluminum having a satisfactory heat conductivity. An opening 16 slightly smaller than the wiring circuit board 4 is formed at the center of the base member 6 (see FIG. 3), and a guide part 6a which is engaged with the periphery of the wiring circuit board 4 so as to guide the same is provided at the edge of the opening 16. A flange 18 having the same configuration as the flange 15 provided in the cap 5 is formed at the periphery of the base member 6. The screw coupling mechanism 8 is provided in the flanges 15 and 18.

The packing member 7 is produced by forming a heat resisting rubber or the like into a loop and accommodated in the accommodating groove 14 formed in the cap 5, as described above. The packing member 7 has the function of hermetically sealing the cavity 13 when the semiconductor device 1 is assembled and serving as a shock absorber between the semiconductor chips 3 and the cap 5.

The screw coupling mechanism 8 consists of screws 19 and nuts 20. The screw coupling mechanism 8 functions to fix the cap 5 and the base member 6 to each other. Through holes 21 and 22 (shown in FIG. 3) are respectively formed in the flanges 15 and 18 formed in the cap 5 and the base member 6, respectively. The cap 5 and the base member 6 are fixed to each other by inserting the screws 19 through the through holes 21 and 22 so as to screw-couple the nuts 20 to the screws 19.

By using the screw coupling mechanism 8 constituted of the screws 19 and the nuts 20 as a fixing mechanism, it is possible to disengage the cap 5 and the base member 6 from each other by removing the nuts 20 from the screws 19. That is, both the fixing and unfixing of the cap 5 and the base board 6 are enabled by using the screw coupling mechanism 8.

A description will now be given of a method of producing the semiconductor device 1 with reference to FIG. 3.

In order to produce the semiconductor device 1, the semiconductor chips 3 are mounted on the upper major surface of the wiring circuit board 4 provided with the thin-film circuit 10 and the connection pins 23 (not shown in FIG. 3). The packing member 7 is accommodated in the accommodating groove 14 of the cap 5, the cap 5 being formed with the cap part 11, the radiating fins 12, the cavity 13 and the accommodating groove 14. The packing member 7 is configured to project downward from the accommodating groove 14 when accommodated therein (described in detail later).

The cap 5 is then attached to the upper major surface of the wiring circuit board 4 having the semiconductor chips 3 mounted thereon, and the base member 6 is attached to the underside of the wiring circuit board 4. As a result, the flange 15 of the cap 5 and the flange 18 of the base member 6 are made to face each other, and the through holes 21 and 22 formed in the flanges 15 and 18, respectively are made to communicate with each other. Since the guide parts 5a and 6a for guiding the wiring circuit board 4 are formed in the cap 5 and the base member 6, respectively, it is easy to put the wiring circuit board 4 in place. Similarly, the positioning of the cap 5 and the base board 6 is easy.

Since the opening 16 is formed in the base member 6, the connection pins 23 extending downward from the underside of the wiring circuit board 4 are made to extend away from the base member 6 through the opening 16.

The screws 19 constituting the screw coupling mechanism 8 are inserted through the through holes 21 and 22, and the nuts 20 are screw-coupled to the screws 19. Thus, the cap 5 and the base member 6 are fixed to each other, and the wiring circuit board 4 is sandwiched between the cap 5 and the base member 6. In this fixed state, the cap 5 and the base member 6 cooperate to constitute a package for encapsulating the semiconductor chips 3.

In this fixed state, the upper major surface of the semiconductor chips 3 is made to directly come into contact with a ceiling 13a of the cavity 13 formed in the cap 5. Specifically, the semiconductor chips 3 are configured to come into contact with the cap 5 in the fixed state by selecting the depth of the cavity 13 appropriately.

Since the packing member 7 placed in the accommodating groove 14 is made to project downward from the accommodating groove 14, the underside of the cap 5 is prevented from coming into contact with the upper major surface of the wiring circuit board 4 when the cap 5 is attached above the wiring circuit board 4. The packing member 7 comes into contact with the upper major surface of the wiring circuit board 4.

While the cap 5 and the base member 6 are fixed to each other by the screw coupling mechanism 8, a small gap 24 is formed between the cap 5 and the base member 6 as shown in enlargement in FIG. 2B. It is also to be noted that a small gap 25 is formed between the upper major surface of the wiring circuit board 4 and the cap 5. The dimension of the gaps 24 and 25 is indicated by h in FIG. 2B. In the fixed state, the wiring circuit board 4 is sandwiched between the packing member 7 provided in the cap 5 and a step part 17 formed in the base member 6. The periphery of the wiring circuit board 4 is guided by the guide parts 5a and 6a formed in the cap 5 and the base member 6, respectively.

Since the semiconductor chips 3 of the semiconductor device 1 produced in the manner described above come into direct contact with the cap 5, the heat generated by the semiconductor chips 3 is transferred to the cap 5 and radiated from the radiating fins 12. The heat radiating efficiency of the semiconductor device 1 is sufficient to cool the semiconductor chips 3 satisfactorily.

The small gaps 24 and 25 having the dimension of h are formed between the cap 5 and the base member 6, and between the upper major surface of the wiring circuit board 4 and the cap 5, respectively. In the fixed state, the wiring circuit board 4 is sandwiched between the packing member 7 and the step part 17 formed in the base member 6. Further, the periphery of the wiring circuit board 4 is guided by the guide parts 5a and 6a formed in the cap 5 and the base member 6, respectively. Hence, the packing member 7 has a satisfactory packing function by isolating the cavity 13 from the environment. The packing member 7 also has the function as a shock absorber for absorbing a stress generated between the semiconductor chips 3 and the cap 5.

When the cap 5 and the base member 6 are fixed to each other by the screw coupling mechanism 8, a mechanical stress may be generated in an area where the semiconductor chips 3 and the cap 5 contact each other. When a solder is used in the semiconductor device 1, a thermal stress may be generated in an area where the semiconductor chips 3 and the cap 5 contact each other.

The wiring circuit board 4 is capable of being slightly displaced in the cavity 13 while being guided by the guide parts 5a and 6a. Since an elastic force of the packing member 7 formed of an elastic material causes the wiring circuit board 4 to be pressed against the base member 6 (step part 17), the mechanical stress or the thermal stress generated in the above-described manner can be absorbed by the packing member 7 being elastically deforming.

Hence, it is possible to prevent various stresses from remaining between the cap 5 and the semiconductor chips 3. Therefore, it is unlikely that a crack is created in the semiconductor chips 3 or the wiring circuit board 4. Accordingly, the reliability of the semiconductor device 1 is improved.

Further, the use of the screw coupling mechanism 8 as a mechanism for fixing the cap 5 and the base member 6 to each other enables the fixing and unfixing of the cap 5 and the base member 6 to be performed easily by using the nuts 20. The wiring circuit board 4 is sandwiched between the cap 5 and the base member 6.

By rotating the nuts 20 to cancel the fixing engagement by the screw coupling mechanism 8, it is easy to remove the wiring circuit board 4 from the package constituted of the cap 5 and the base member 6. In this way, the maintainability of the device is improved.

Since the screws 19 and the nuts 20 employed in the screw coupling mechanism 8 are generally available, it is possible to construct the screw coupling mechanism 8 inexpensively, and the fixing and unfixing of the cap 5 and the base member 6 is easy to perform.

In order to mount the semiconductor device 1 on the mounting base board 2, connecting holes 26 are formed in the respective positions in the mounting base board 2 so as to correspond to the connection pins 23. When mounting the semiconductor device 1, the connection pins 23 are inserted through the connecting holes 26 and the connection pins 23 which project from the backside of the mounting base board 2 are soldered to the mounting base board 2. In this way, the semiconductor device 1 is fixed to the mounting base board 2, and electrical connection is established between the semiconductor device 1 and the mounting base board 2. Since the base member 6 has the opening 16 and the connection pins 23 extend downward through the opening 16, the base member 6 does not interfere with the soldering operation of the connection pins 23.

Figure 4:
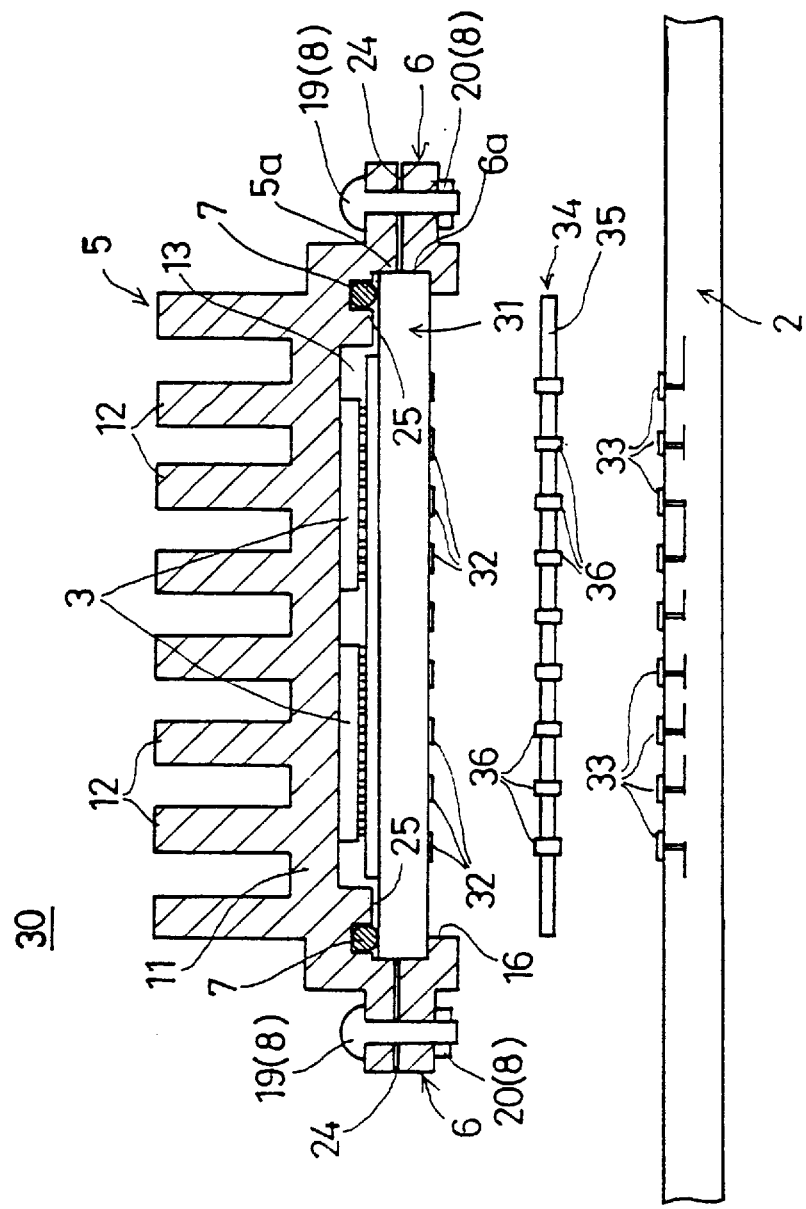
FIG. 4 is a cross-sectional view of a first variation of the semiconductor device according to the first embodiment.
Figure 5:
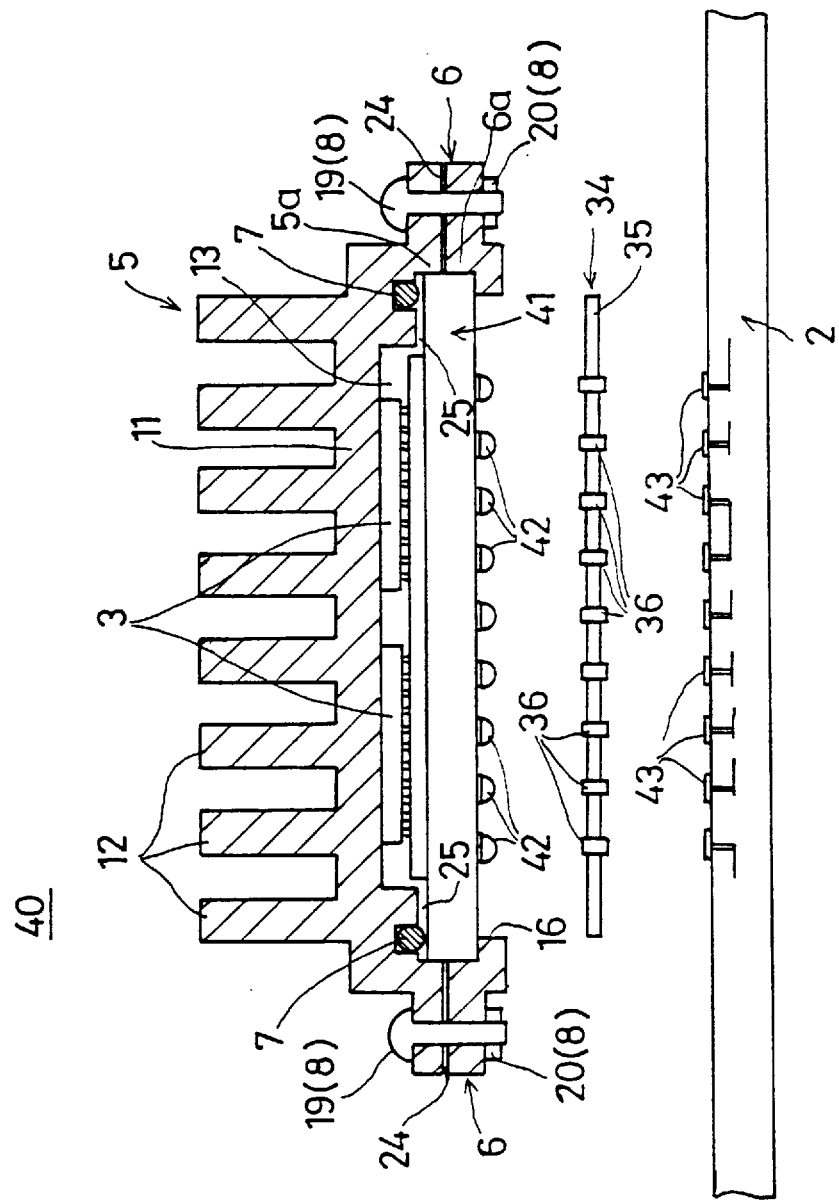
FIG. 5 is a cross-sectional view of a second variation of the semiconductor device according to the first embodiment.

FIG. 4 illustrates a semiconductor device 30 which is a first variation of the semiconductor device 1 according to the first embodiment. FIG. 5 illustrates a semiconductor 40 which is a second variation of the semiconductor device 1 according to the first embodiment. In FIGS. 4 and 5, those components that correspond to the components of the semiconductor device 1 according to the first embodiment described with reference to FIGS. 2A, 2B and 3 are designated by the same numerals and the descriptions thereof are omitted.

The semiconductor device 30 shown in FIG. 4 is a configured such that connection pads 32 for connection to external devices are provided on the underside of a wiring circuit board 31 instead of the connection pins 23, and electrode pads 33 are provided at respective positions on the mounting base board 2 opposite to the connection pads 32.

In the construction in which the connection pads 32 are provided on the underside of the wiring circuit board 31, a gap is created between the connection pads 32 formed in the wiring circuit board 31 and the electrode pads 33 formed in the mounting base board 2. For this reason, a flat socket 34 is interposed between the wiring circuit board 31 and the mounting base board 2.

The socket 34 is configured such that electrode parts 36 formed of a conductive rubber or the like are provided on a base member 35 formed of a deformable insulating material. Therefore, by placing the socket 34 in a gap created between the connection pads 32 and the electrode pads 33, electrical connection is established between the connection pads 32 and the electrode pads 33 via the electrode parts 36.

The semiconductor device 40 shown in FIG. 5 is configured such that connection bumps 42 (solder bumps, in this embodiment) for connection to external devices are provided on the underside of a wiring circuit board 41 instead of the connection pins 23, and electrode pads 43 are provided at respective positions on the mounting base board 2 opposite to the connection bumps 42.

A gap is created between the connection bumps 42 and the electrode pads 43. For this reason, the flat socket 34 as described in the first variation is interposed between the connection bumps 42 and the electrode pads 43.

As described above, connection terminals provided in the wiring circuit board (4, 31, 41) may be pins (the connection pins 23), pads (the connection pads 32) or bumps (the connection bumps 42).

When the connection pins 23 are used, the socket 34 is not necessary to connect the wiring circuit board 4 and the mounting base board 2 electrically. When the connection pads 32 or the connection bumps 42 are used, it is possible to produce a semiconductor device having a large number of terminals.

Figure 6:
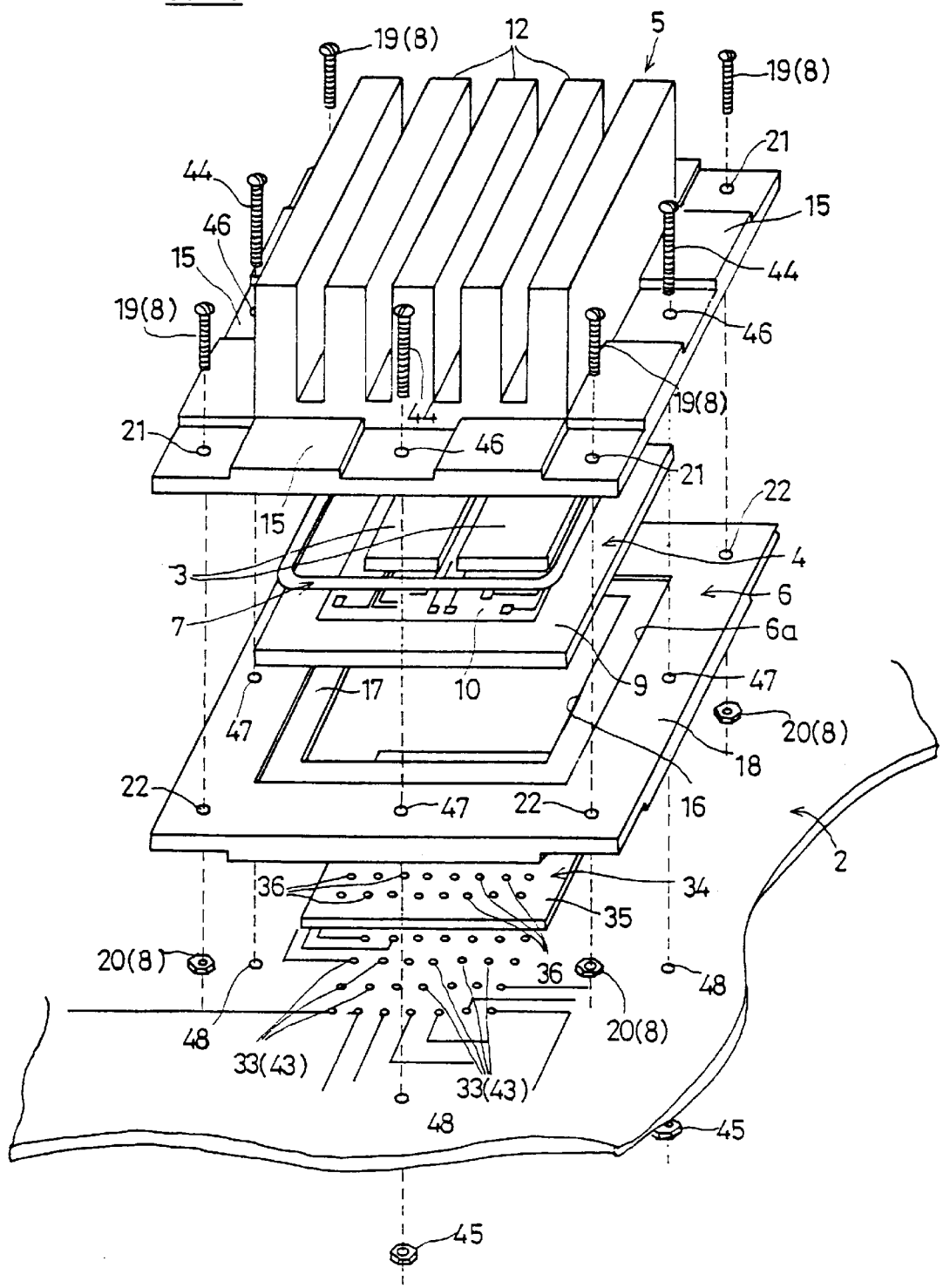
FIG. 6 is an exploded perspective view showing how the first and second variations of the semiconductor device according to the first embodiment is mounted on a mounting base board.

FIG. 6 illustrates how the semiconductor device 30 of the first variation or the semiconductor device 40 of the second variation is mounted on the mounting base board 2.

When the semiconductor device 30 or the semiconductor device 40 is mounted on the mounting base board 2, mounting screws 44 and mounting nuts 45 are used. Through holes 46 and 47 for the mounting screws 44 are formed in the flanges 15 and 18, respectively. Through holes 48 for the mounting screws 44 are formed in the mounting base board 2.

The semiconductor device 30 or the semiconductor device 40 can be mounted by inserting the mounting screws 44 in the through holes 46, 47 and 48, and by screw coupling the mounting nuts 45 to the mounting screws 44 which project from the backside of the mounting base board 2.

In the mounting method described above, the process for soldering the connection pins 23 of the first embodiment is not necessary. Since the semiconductor device 30 or the semiconductor device 40 can be mounted on the mounting base board 2 only by screw coupling the mounting nuts 45 to the mounting screws 44, the mounting operation is facilitated. Similarly to the screw coupling mechanism 8 described previously, the mounting screws 44 and the mounting nuts 45 make it possible to detach the semiconductor device 30 or the semiconductor device 40 from the mounting base board 2. Hence, the maintainability is improved.

FIGS. 7 through 10 illustrate a semiconductor device 50 according to a second embodiment of the present invention.

Figure 7:
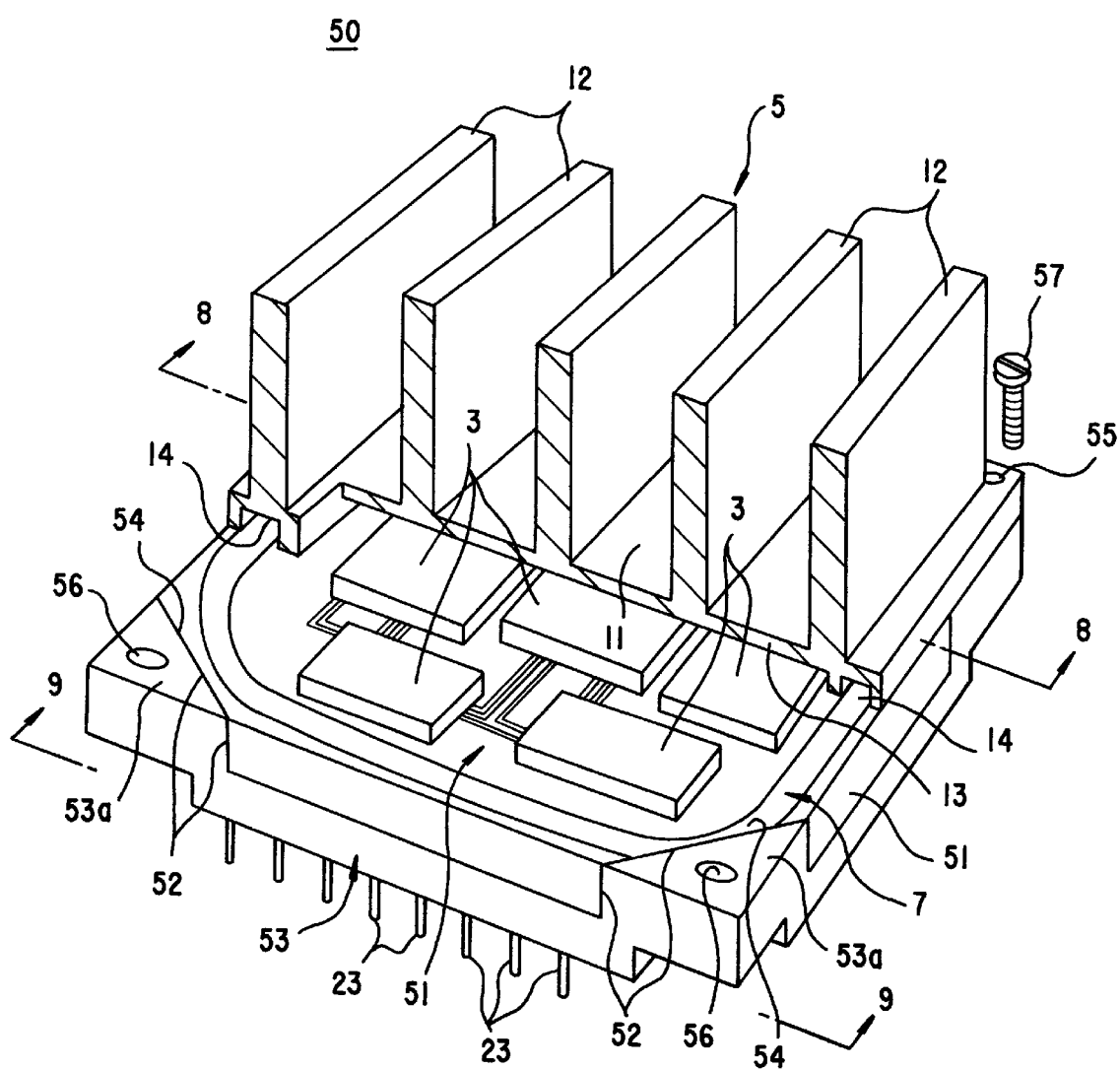
FIG. 7 is a partially sectioned perspective view of a semiconductor device according to a second embodiment of the present invention.
Figure 8:
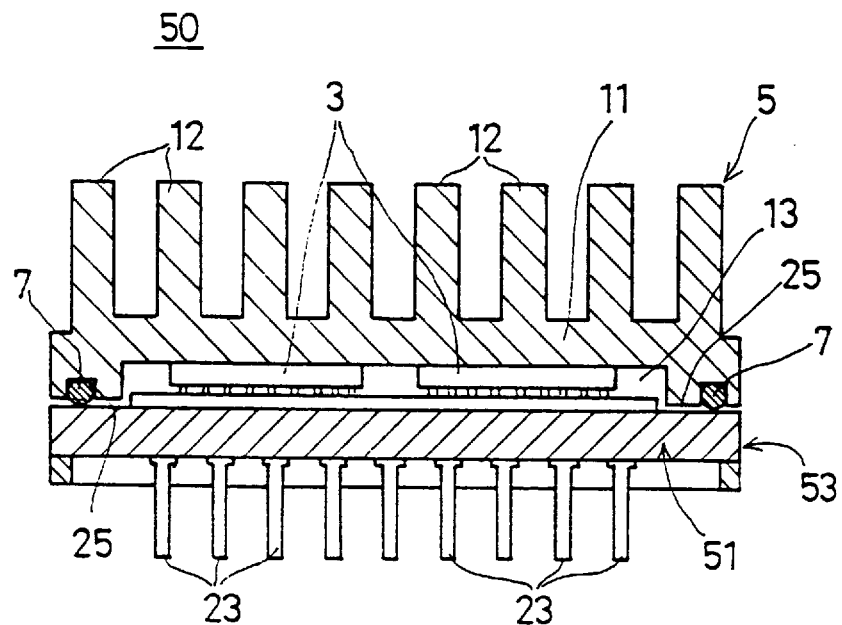
FIG. 8 is a cross-sectional view taken along the line 8—8 of FIG. 7.
Figure 9:
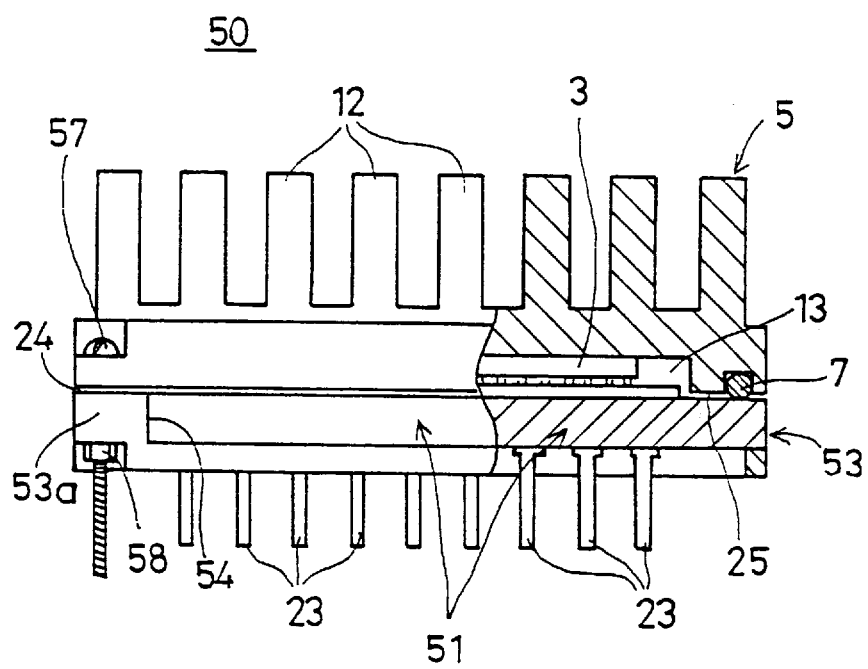
FIG. 9 is a partially sectioned front view taken along the line 9—9 of FIG. 7.
Figure 10:
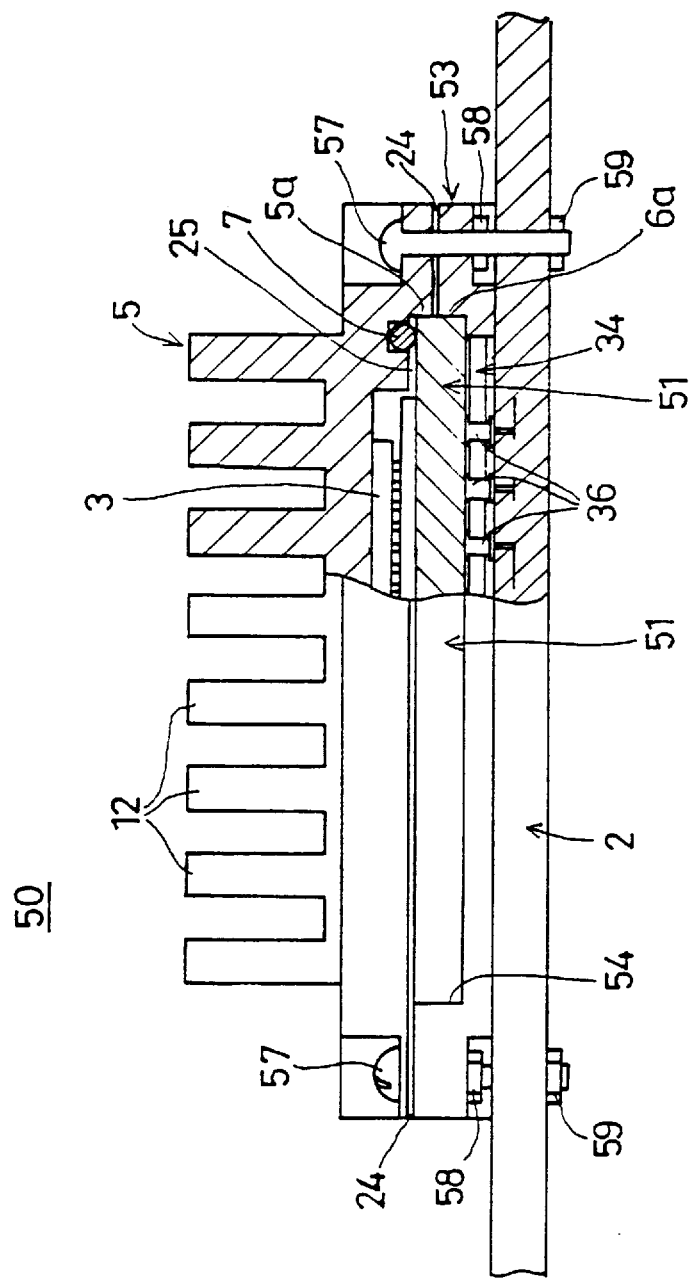
FIG. 10 is a partially sectioned front view which explains how the semiconductor device according to the second embodiment is mounted on a mounting base board.

FIG. 7 is a perspective view of the semiconductor device 50 with parts broken away, FIG. 8 is a cross-sectional view taken along the line 8—8 of FIG. 7, FIG. 9 is a partially sectioned front view taken long the line 9—9 of FIG. 7, and FIG. 10 is a partially sectioned front view which explains how the semiconductor device 50 is mounted on the mounting base board 2. Those components that correspond to the components of the semiconductor device 1 of the first embodiment described with reference to FIGS. 2A, 2B and 3 are designated by the same reference numerals and the descriptions thereof are omitted.

The semiconductor device 50 is configured such that the flanges 15 and 18 are not formed. Instead, notches 52 are formed at the four corners of a wiring circuit board 51, and engagement parts 53a engageable with the notches 52 are formed at the four corners of a base member 53. Further, through holes 55 and 56 for the screws 19 are formed at the four corners of the cap 5 and the base member 53. The inner walls of the engagement parts 53a function as guide parts 54.

Generally, no electronic parts or wiring patterns are formed in the four corners of the wiring circuit board 51. In other words, dead space is created in the four corners. In this embodiment, the corners are removed so that the notches 52 form triangles with the adjacent sides of the wiring circuit board 51. The wiring circuit board 51 is mounted on the base member 53 by the engagement parts 53a being engaged with the notches 52 in the base member 53.

The second embodiment is configured such that, by forming the notches 52, the dead space created in the corners of the wiring circuit board 51 can be used as locations for the screw coupling mechanism 8. Accordingly, unlike the first embodiment, it is not necessary to form the flanges 15 and 18. Consequently, the semiconductor device 50 is more compact than the device in which the flanges 15 and 18 are formed.

As shown in FIG. 10, the semiconductor device 50 (FIG. 10 shows a construction wherein the connection pads 32 are used as connection terminals) of this embodiment is mounted using the double-nut construction wherein two nuts 58 and 59 are screw-coupled to each of dual purpose screws 57.

The embodiment shown in FIG. 6 is configured such that the screws 19 serve the purpose of fixing the cap 5 and the base member 6 to each other and the mounting screws 44 serve the purpose of fixing the semiconductor device 30 or the semiconductor device 40 to the mounting base board 2. By employing the double-nut construction as in the second embodiment, the fixing of the cap 5 and the base member 53 to each other and the mounting of the semiconductor device 50 to the mounting base board 2 are effected using the dual purpose screws 57. In this respect, the semiconductor device 50 is more compact than the device produced otherwise.

While the semiconductor chips 3 and the cap 5 are allowed to contact each other in the embodiments described above, it is also possible to interpose a material having a high heat conductivity (for example, an adhesive having a high heat conductivity) between the semiconductor chips 3 and the cap 5 so that the semiconductor chips 3 come into contact with the cap 5 indirectly. According to this construction, the heat generated by the semiconductor chips 3 can be efficiently radiated, and the stress applied to the semiconductor chips 3 can be reduced because the high-conductivity material functions as a shock absorber.

A description will now be given of multi-chip modules in which the semiconductor chips are provided both on the upper major surface of the wiring circuit board and on the lower major surface of the wiring circuit board.

Figure 11:
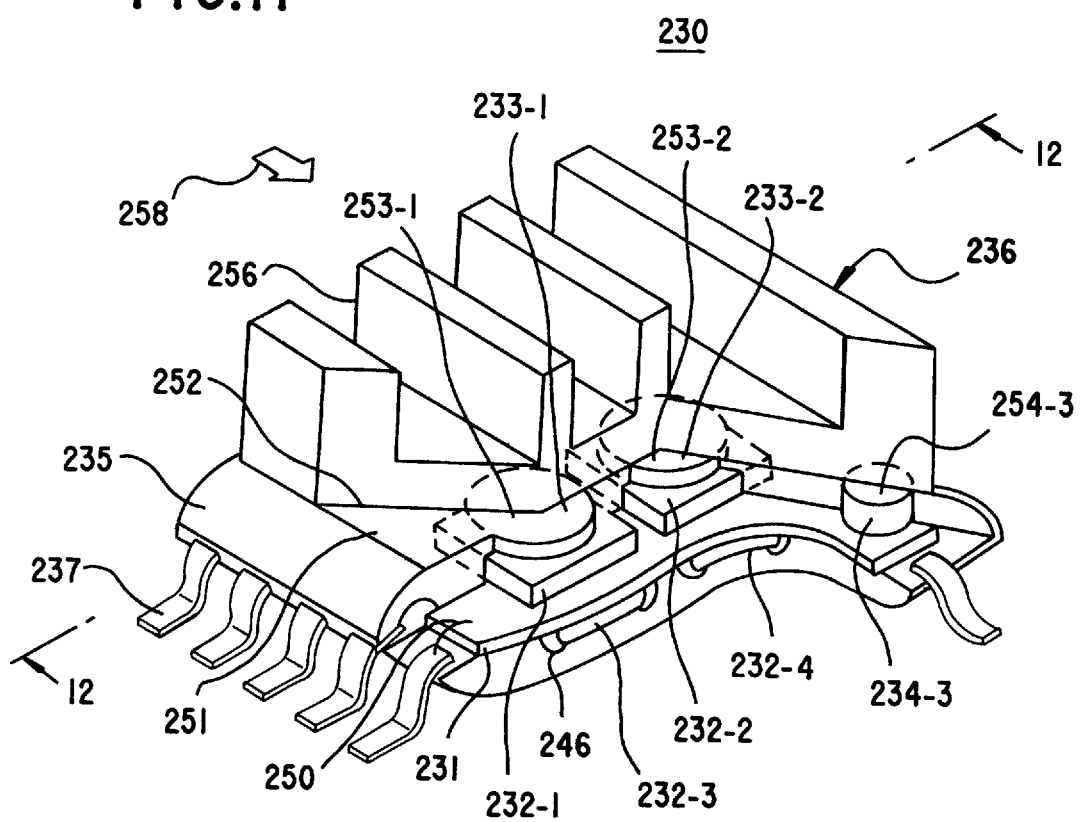
FIG. 11 is a partially sectioned perspective view of a multi-chip module according to a third embodiment the present invention.
Figure 12:
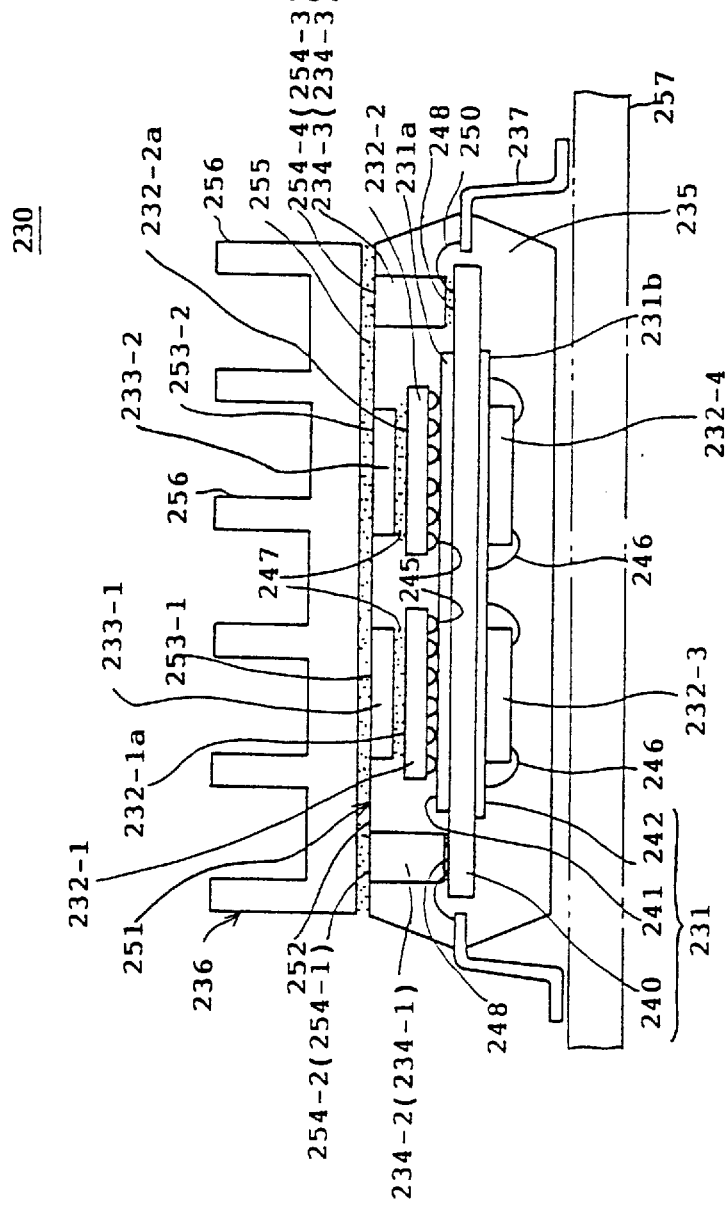
FIG. 12 is a cross-sectional view taken along the line 12—12 of FIG. 11.
Figure 13:
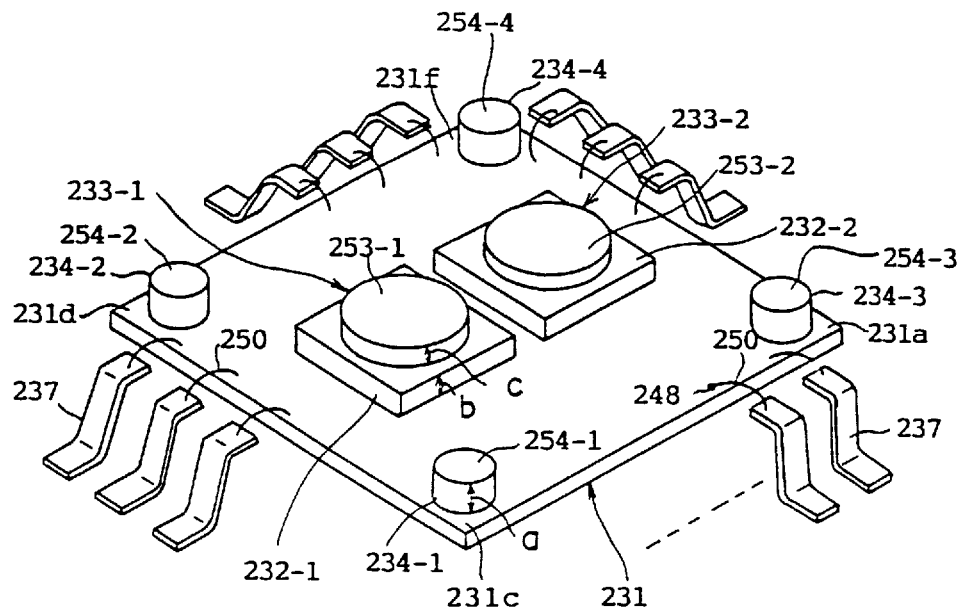
FIG. 13 is a perspective view of the multi-chip module of FIG. 11 with a resin package and heat radiating fins removed.

FIGS. 11 through 13 illustrate a multi-chip module 230 according to a third embodiment of the present invention.

The multi-chip module 230 comprises a thin-film multi-layer circuit board 231 having a generally square shape; four semiconductor chips including a central processing unit (CPU) chip $232_{-1}$, a control memory unit (CMU) chip $232_{-2}$ and static random access memory (SRAM) chips $232_{-3}$ and $232_{-4}$; two first heat conductive blocks $233_{-1}$ and $233_{-2}$; four second heat conductive blocks $234_{-1}$–$234_{-4}$; a resin package 235; a heat sink 236; and a large number of leads 237.

As shown in FIG. 12, the thin-film multi-layer circuit board 231 comprises: a ceramic base board 240 of AlN having a high heat conductivity; a thin-film multi-layer wiring layer 241 formed on the upper major surface of the base board 240; and a thin-film multi-layer wiring layer 242 formed on the lower major surface of the base board 24.

AlN has a heat conductivity of 150–200 w/mK, which is ten times as high as the heat conductivity of $Al_2O_3$, a normal ceramic material.

Of the four semiconductor chips, the CPU chip $232_{-1}$ radiates the largest amount of heat, followed by the CMU chip $232_{-2}$ and the SRAM chips $232_{-3}$ and $232_{-4}$.

The CPU chip $232_{-1}$ and the CMU chip $232_{-2}$, which are known to radiate the largest amount of heat, are mounted at the center of the upper major surface 231a of the thin-film multi-layer circuit board 231.

The CPU chip $232_{-1}$ and the CMU chip $232_{-2}$ are mounted by face-down flip-chip bonding using bumps 245 so that respective backsides $232_{1a}$ and $232_{-2a}$ thereof are made to face upward.

The SRAM chips $232_{-3}$ and $232_{-4}$, which are the semiconductor chips that radiate a smaller amount of heat than the CPU chip $232_{-1}$ and the CMU chip $232_{-2}$, are mounted at the center of the lower major surface 231b of the thin-film multi-layer circuit board 231.

The SRAM chips $232_{-3}$ and $232_{-3}$ are mounted on the lower major surface 231b of the circuit board 231 by face-up die bonding. Wires 246 are made to extend between the SRAM chips and pads.

The first heat conductive blocks $233_{-1}$ and $233_{-2}$ are formed of AlN having a high heat conductivity and have the shape of columns of the same size as the CPU chip $232_{-1}$ and the CMU chip $232_{-2}$.

The first heat conductive blocks $233_{-1}$ and $233_{-2}$ are attached to the upper major surface (backside) $232_{-1a}$ and the upper major surface (backside) $232_{2a}$ of the CMU chip $232_{-2}$, respectively, using a silver paste 147, an adhesive having a high heat conductivity.

The second heat conductive blocks $234_{-1}$–$234_{-4}$ are formed of AlN having a high heat conductivity and have the shape of a column.

The second heat conductive blocks $334_{-1}$–$234_{-4}$ are attached near corners 231c–231f of the upper major surface 231a of the thin-film multi-layer circuit board 231 using a silver paste 148, an adhesive having a high heat conductivity.

The thin-film multi-layer wiring layer 241 is not formed in the neighborhood of the corners 231c–231f of the thin-film multi-layer circuit board 231. Hence, the second heat conductive blocks $234_{-1}$–$234_{-4}$ are attached directly to the surface of the ceramic base board 240 having a high heat conductivity.

Accordingly, since the thin-film multi-layer wiring layer 241 does not intervene, the thermal resistance between the thin-film multi-layer circuit board 231 and the second heat conductive blocks $234_{-1}$–$234_{-4}$ is small.

The height (thickness) a of the second heat conductive blocks $234_{-1}$–$234_{-4}$ is configured to be substantially the same as a sum of the height (thickness) b of the CPU chip $232_{-1}$ and the height (thickness) c of the first heat conductive block $233_{-1}$.

The leads 237 are arranged along the four sides of the thin-film multi-layer circuit board 231 so as to extend outward.

Each of the leads 237 is formed into the shape of a crank.

Wires 250 connect inner ends of the leads 237 and pads 248 provided along the periphery of the thin-film multi-layer circuit board 231.

The resin package 235 is formed by transfer molding and encapsulates the thin-film multi-layer circuit board 231, the four chips $232_{-1}$–$232_{-4}$, the first heat conductive blocks $233_{-1}$–$233_{-4}$, the second heat conductive blocks $234_{-1}$–$234_{-4}$ and parts of the leads 237.

Referring to FIGS. 11 and 12, a lapped surface 251 includes an upper major surface 252 of the lapped resin package, lapped upper major surfaces $253_{-1}$ and $253_{-2}$ of the first heat conductive blocks and lapped upper major surfaces $254_{-1}$–$254_{-4}$ of the lapped second heat conductive blocks.

The lapped upper major surfaces $253_{-1}$, $253_{-2}$, $254_{-1}$–$254_{-4}$ of the first and second heat conductive blocks $233_{-1}$, $233_{-2}$ and $234_{-1}$–$234_{-4}$, respectively, are flush with each other.

The heat sink 236 has the same size as the thin-film multi-layer circuit board 231 and attached to the surface 251 by a silicone resin adhesive 255.

The heat sink 236 is in close contact with the upper major surfaces $253_{-1}$, $253_{-2}$, $254_{-1}$–$254_{-4}$ of the first and second heat conductive blocks $233_{-1}$, $233_{-2}$ and $234_{-1}$–$234_{-4}$.

The heat sink 236 has a plurality of radiating fins 256 arranged on its upper major surface.

The multi-chip module 230 is constructed in the manner described above.

In the multi-chip module 230, the heat conducting passage is formed to extend from the circuit board 231 to the heat sink 236 via the second heat conductive blocks $234_{-1}$–$234_{-4}$.

The multi-chip module 230 is mounted on a motherboard 257 by soldering the leads 237 thereto.

The motherboard is built into an electronic apparatus such that a cooling wind 58 flows in the longitudinal direction of the heat radiating fins 256.

Figure 14:
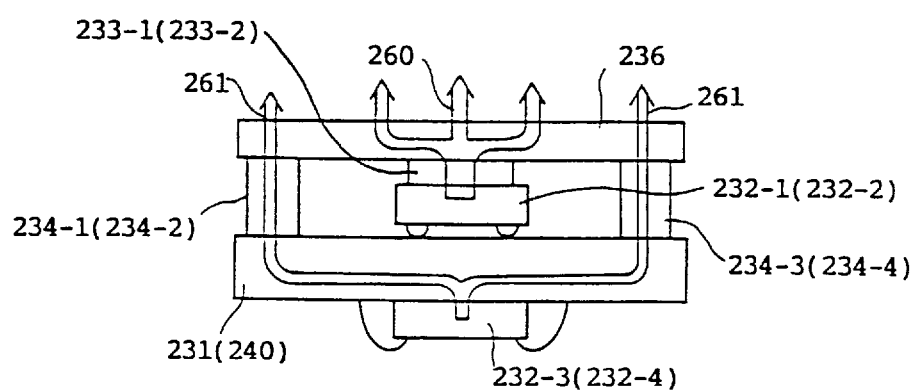
FIG. 14 is a schematic view showing how the heat generated in the multi-chip module of FIGS. 11 and 12 is radiated.

A description will now be given of how the heat is radiated while the multi-chip module 30 is operating, with reference to FIG. 14, particularly.

First, a description will be given of how the heat generated by the CPU chip $232_{-1}$ and the CMU chip $232_{-2}$ mounted on the upper major surface 231a of the thin-film multi-layer circuit board 231 is radiated.

As indicated by an arrow 260, the heat generated within the CPU chip $232_{-1}$ and the CMU chip $232_{-2}$ is transferred to the first heat conductive blocks $233_{-1}$ and $233_{-2}$ via the backsides $232_{-1a}$ and $232_{-2a}$ of the respective chips. The heat is then transferred to the heat sink 236 and radiated to the surrounding atmosphere via the radiating fins 256 exposed to the cooling wind.

The heat radiating (conducting) passage 260 is short and has a small thermal resistance.

Accordingly, while the CPU chip $232_{-1}$ and the CMU chip $232_{-2}$ generate a large amount of heat, the generated heat is efficiently radiated.

A description will next be given of how the heat generated by the SRAM chips $232_{-3}$ and $232_{-4}$ mounted on the lower major surface 231b of the thin-film multi-layer circuit board 231 is radiated.

As indicated by an arrow 261, the heat generated within the SRAM chips $232_{-3}$ and $232_{-4}$ is transferred to the ceramic base board 240 having a high heat conductivity. The heat then spreads in the ceramic base board 240. The heat is then transferred to the second heat conductive blocks $234_{-1}$–$234_{-4}$ at the corners 231c–231f of the ceramic base board 240 and then transferred upward in FIG. 14 through the second heat conductive blocks $234_{-1}$–$234_{-4}$. The heat is finally transferred to the heat sink 236 and radiated to the surrounding atmosphere via the radiating fins 256 exposed to the cooling wind.

Since the SRAM chips $232_{-3}$ and $232_{-4}$ are mounted on the lower major surface 231b of the circuit board 231, it is otherwise difficult to radiate the heat generated therefrom. However, as described above, this embodiment ensures that the heat generated by the SRAM chips $232_{-3}$ and $232_{-4}$ is radiated efficiently.

Thus, in the multi-chip module 230 having the above construction, not only the heat generated by the chips $232_{-1}$ and $232_{-2}$ mounted on the upper major surface 231a of the thin-film multi-layer circuit board 231 but also the heat generated by the chips $232_{-3}$ and $232_{-4}$ mounted on the lower major surface 231b of the thin-film multi-layer circuit board 231 is radiated efficiently.

A description will now be given of a method of producing the multi-chip module 230, with reference to FIGS. 15 and 16A–16F.

Figure 15:
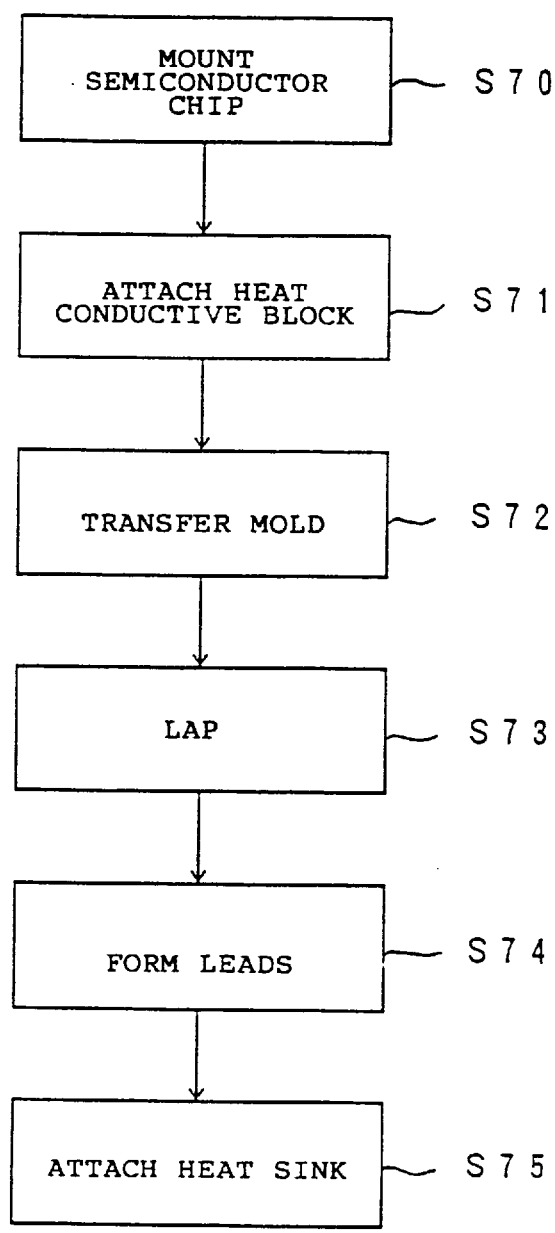
FIG. 15 is a flowchart showing steps of producing the multi-chip module of FIG. 11
Figure 16A:
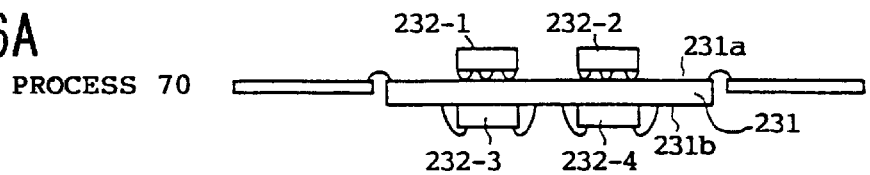
FIGS. 16A–16F show states of the multi-chip module in the respective steps of FIG. 15.

In a step S70 indicated in FIG. 15, the CPU chip $232_{-1}$ and the CMU chip $232_{-2}$ are mounted on the upper major surface 231a of the thin-film multi-layer circuit board 231 by flip-chip bonding (see FIG. 16A).

Figure 16B:
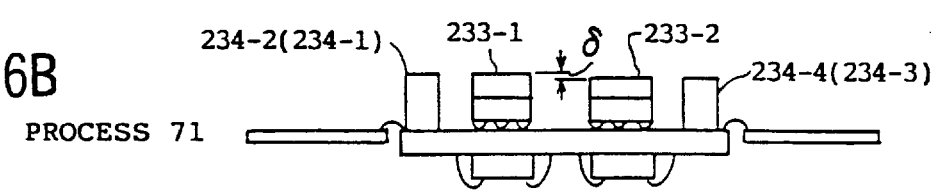

The SRAM chips $232_{-3}$ and $232_{-4}$ are die-bonded and wire-bonded to the lower major surface 231b of the circuit board 231 (see FIG. 16B).

In a step S71, the first heat conductive blocks $233_{-1}$ and $233_{-2}$ are attached to the upper major surface of the CPU chip $232_{-1}$ and the CMU chip $232_{-2}$ using the silver paste.

The second heat conductive blocks $234_{-1}$–$234_{-4}$ are attached to the circuit board 231 so as to stand in the neighborhood of the corners thereof using the silver paste.

Due to variations in the dimensions of the first and second heat conductive blocks $233_{-1}$, $233_{-2}$ and $234_{-1}$–$234_{-4}$, the upper major surfaces thereof are located on slightly different planes, with the result that a height difference δ exists.

Thus, in this state, it is not likely that the heat sink 236 is in close contact with all the heat conductive blocks $233_{-1}$, $233_{-2}$ and $234_{-1}$–$234_{-4}$. Therefore, a lapping process described later is carried out.

Figure 16C:
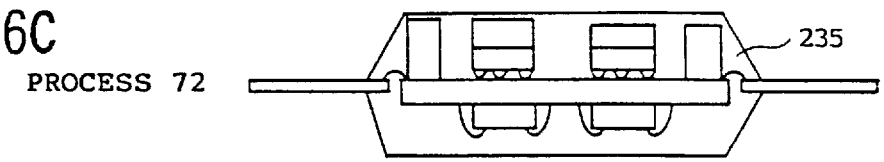

In a step S72, the transfer molding process is carried out after the silver paste is hardened, thus forming the resin package 235 (see FIG. 16C).

Figure 16D:
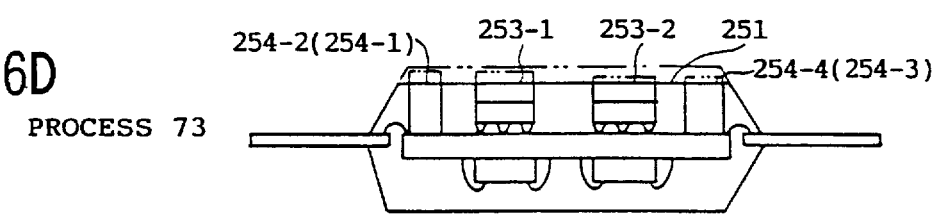

In a step S73, the upper major surface of the resin package 235 is lapped slightly so as to expose all the heat conductive blocks $233_{-1}$, $233_{-2}$ and $234_{-1}$–$234_{-4}$ (see FIG. 16D).

As a result, the surfaces $253_{-1}$, $253_{-2}$ and $254_{-1}$–$254_{-4}$ are exposed so as to be flush with the upper major surface 251 of the resin package 235.

It is to be noted that the heat conductive blocks $233_{-1}$, $233_{-2}$ and $234_{-1}$–$234_{-4}$ are embedded and firmly held in the resin package 235.

Therefore, the lapping of the heat conductive blocks $233_{-1}$, $233_{-2}$ and $234_{-1}$–$234_{-4}$ can be performed in a stable manner.

Figure 16E:
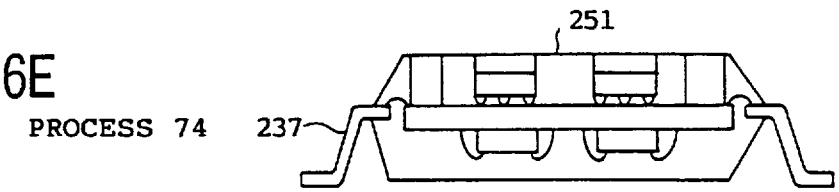

In a step S74, the leads 237 are formed (see FIG. 16E).

Figure 16F:
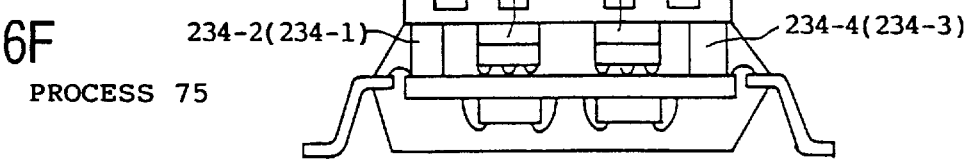

In a step S75, the heat sink 236 is attached to the upper major surface of the resin package 235 using a silicone resin adhesive (see FIG. 16F).

The heat sink 236 is fitted to be in close contact with all the heat conductive blocks $233_{-1}$, $233_{-2}$ and $234_{-1}$–$234_{-4}$.

In this way, the multi-chip module 230 having a favorable heat radiating characteristic is obtained.

A description will now be given of a fourth embodiment of the present invention.

Figure 17:
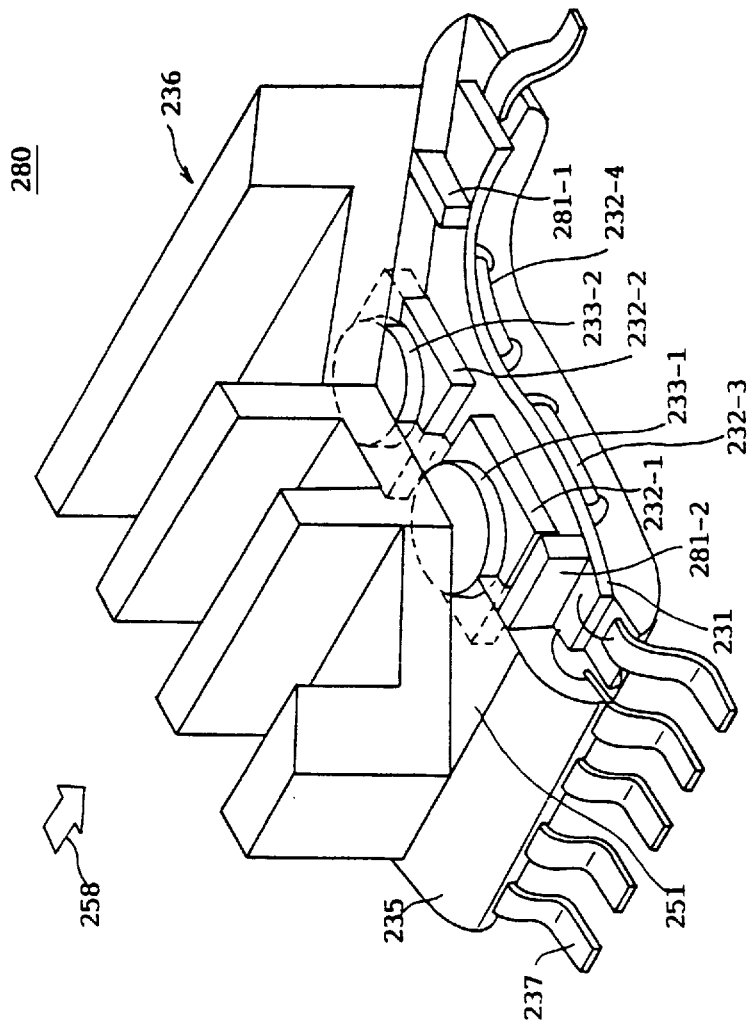
FIG. 17 is a partially sectioned perspective view of a multi-chip module according to a fourth embodiment.
Figure 18:
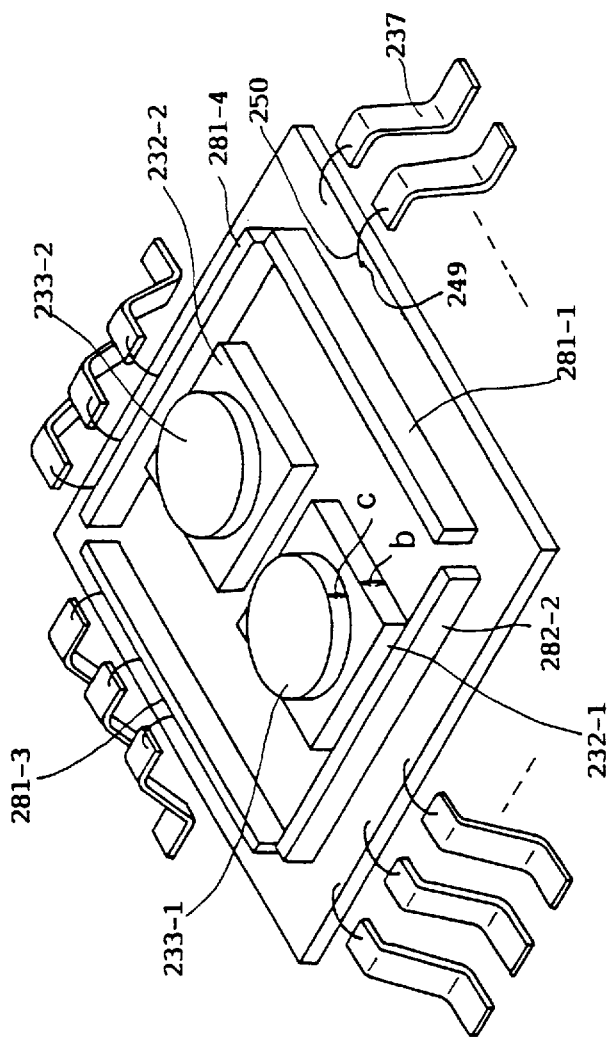
FIG. 18 is a perspective view of the multi-chip module of FIG. 17 with a resin package and heat radiating fins removed.

FIGS. 17 and 18 illustrate a multi-chip module 280 according to the second embodiment.

In FIG. 17 and 18, those components that correspond to the component of shown in FIGS. 11 and 12 are designated by the same reference numerals and the description thereof is omitted.

The multi-chip module 280 is a variation of the multi-chip module 230 of the first embodiment. However, second heat conductive blocks $281_{-1}$–$281_{-4}$ having rectangular cross sections are provided instead of the columnar second heat conductive blocks $234_{-1}$–$234_{-4}$ so as to surround the CPU chip $232_{-1}$ and the CMU chip $232_{-2}$.

The heat generated by the CPU chip $232_{-1}$ and the CMU chip $232_{-2}$ and the SRAM chips $232_{-3}$ and $232_{-4}$ is radiated similarly to the heat generated in the multi-chip module 230.

The second heat conductive blocks $281_{-1}$–$281_{-4}$ are not attached directly to the base board 240 but attached to the surface of the thin-film multi-layer wiring layer 241. Therefore, the thermal resistance between the circuit board 231 and the blocks $281_{-1}$–$281_{-4}$ is greater than the corresponding heat resistance in the third embodiment. However, the cross-sectional area of the second heat conductive blocks $281_{-1}$–$281_{-4}$ is significantly larger than the corresponding area of the first embodiment. Hence, the heat generated by the SRAM chips $232_{-3}$ and $232_{-4}$ is radiated efficiently.

A description will now be given of the fifth embodiment of the present invention.

Figure 19:
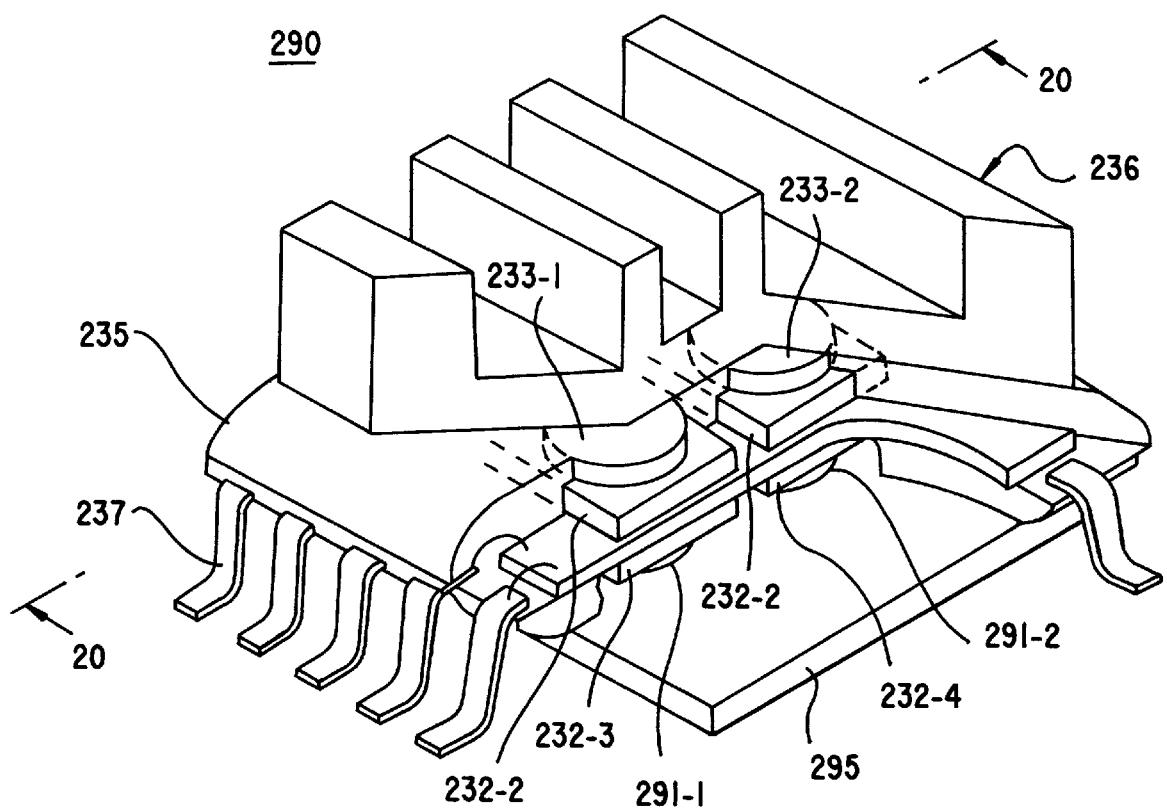
FIG. 19 is a partially sectioned perspective view of a multi-chip module according to a fifth embodiment of the present invention.
Figure 20:
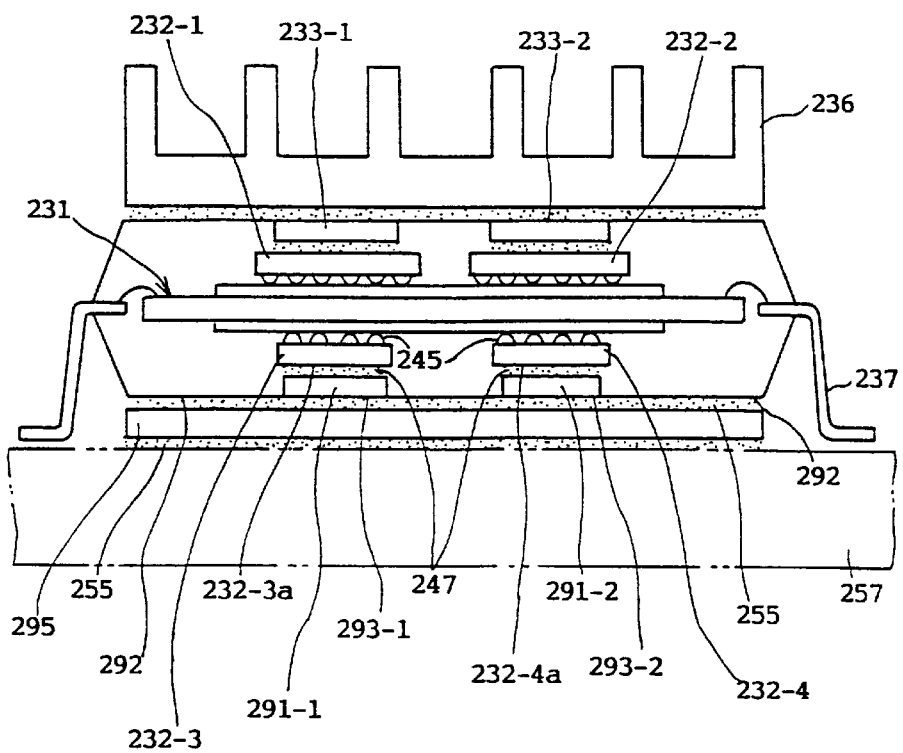
FIG. 20 is a cross-sectional view taken along the line 20—20 of FIG. 19.

FIGS. 19 and 20 illustrate a multi-chip module 290 according to the fifth embodiment.

In FIGS. 19 and 20, those components that correspond to the components shown in FIGS. 11 and 12 are designated by the same reference numerals and the description thereof is omitted.

The construction of the circuit board 231 and the part above is the same as the corresponding construction of the multi-chip module 230 of the first embodiment, and the description thereof is omitted.

A description will be given of the construction of the part below the circuit board 231.

Like the CPU chip $232_{-1}$ and CMU chip $232_{-2}$, the SRAM chips $232_{-3}$ and $232_{-4}$ are mounted on the lower major surface 231b of the circuit board 231 by flip-chip bonding using the bumps 245. Backsides $232_{-3a}$ and $232_{-4}$ of the SRAM chips $232_{-3}$ and $232_{-4}$, respectively, are in face down positions.

The second heat conductive blocks $234_{-1}$–$234_{-4}$ shown in FIGS. 11 and 12 are not provided in this embodiment.

Referring to FIGS. 19 and 20, third heat conductive blocks $291_{-1}$ and $291_{-2}$ have the same dimensions as the first heat conductive blocks $233_{-1}$ and $233_{-2}$ and are formed of the same material.

The third heat conductive blocks $291_{-1}$ and $291_{-2}$ are attached to the lower major surfaces (backsides) $232_{-3a}$ and $232_{-4a}$ of the SRAM chips $232_{-3}$ and $232_{-4}$ using the silver paste 247. The third heat conductive blocks $29_{-1}$ and $291_{-2}$ are fixed in their positions by the resin package 235.

The resin package 235 has a lapped lower major surface 292.

Lapped lower major surfaces $293_{-1}$ and $293_{-2}$ of the third heat conductive blocks $291_{-1}$ and $291_{-2}$ are exposed in the lower major surface 292 such that the lower major surfaces $293_{-1}$ and $293_{-2}$ are flush with each other.

A heat conductive plate 295 formed of AlN and having the same size as the circuit board 231 is attached to the lower major surface 292 of the resin package 235 by the silicone resin adhesive 255.

The heat conductive plate 295 is in close contact with the lower major surfaces $293_{-1}$ and $293_{-2}$ of the third heat conductive blocks $291_{-1}$ and $291_{-2}$.

The multi-chip module 290 is constructed as described above.

The multi-chip module 290 is produced by a method similar to the method for producing the multi-chip module 230 of the third embodiment.

As shown in FIG. 20, the multi-chip module 290 is mounted on the motherboard 257 such that the leads 237 are soldered to the pads on the motherboard 257 and the heat conductive plate 295 is attached to the motherboard 257 by the silicone resin adhesive 255.

Figure 21:
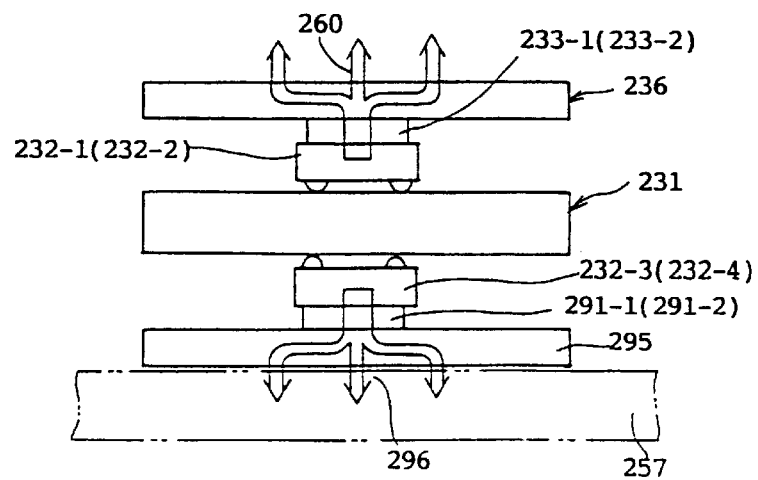
FIG. 21 is a schematic view showing how the heat generated in the multi-chip module of FIGS. 19 and 20 is radiated.

FIG. 21 shows how the heat generated while the multi-chip module 290 is operating is radiated.

A description will first be given of how the heat generated by the CPU chip $232_{-1}$ and the CMU chip $232_{-2}$ mounted on the upper major surface 231a of the circuit board 231 is radiated.

As indicated by the arrow 260, similarly to the third embodiment, the heat generated within the CPU chip $232_{-1}$ and the CMU chip $232_{-2}$ is transferred to the heat sink 236 via the heat conductive blocks $233_{-1}$ and $233_{-2}$ to be radiated to the surrounding atmosphere via the radiating fins 256.

A description will now be given of how the heat generated by the SRAM chips $232_{-3}$ and $232_{-4}$ mounted on the lower major surface 231b of the circuit board 231 is radiated.

As indicated by an arrow 296, the heat generated within the SRAM chips $232_{-3}$ and $232_{-4}$ is transferred to the heat conductive plate 295 via the third heat conductive blocks $291_{-1}$ and $291_{-2}$ so as to spread in the heat conductive plate 295.

The heat is then transferred to the motherboard 257.

The heat spreads in the motherboard 257 and is radiated in the surrounding atmosphere via the surface of the motherboard 257.

A description will now be given of a sixth embodiment of the present invention.

Figure 22:
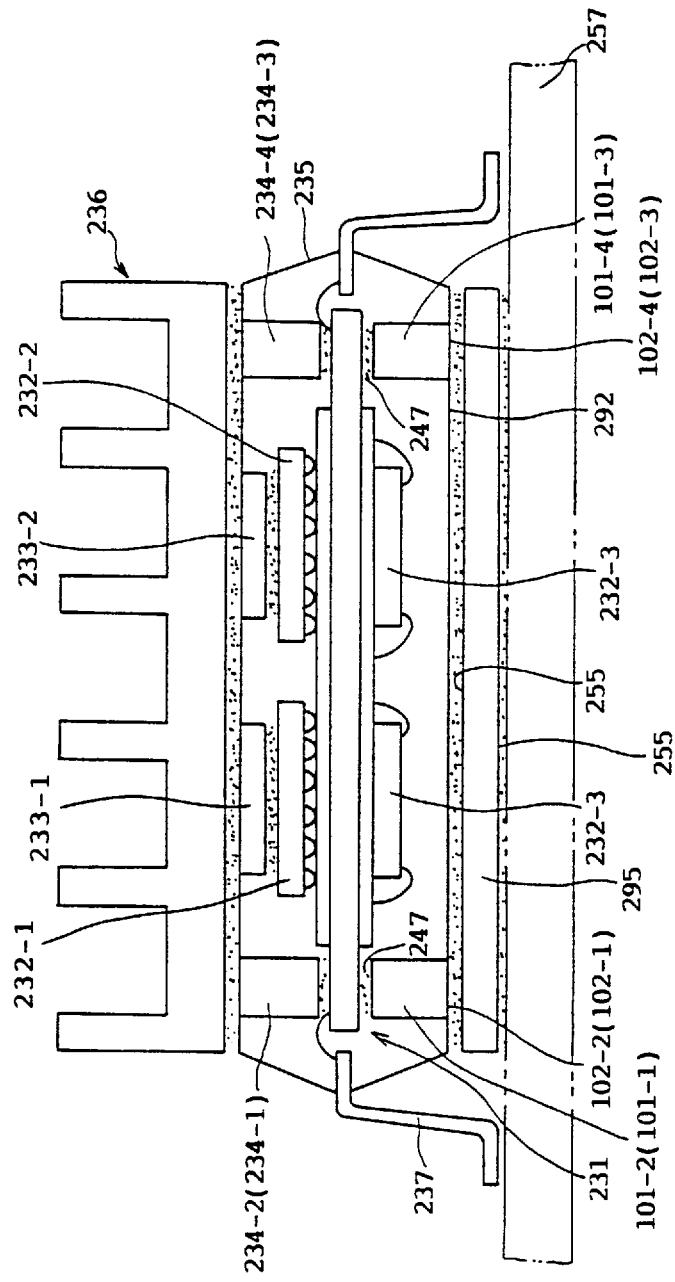
FIG. 22 is cross-sectional view of a multi-chip module according to a sixth embodiment of the present invention.
Figure 23:
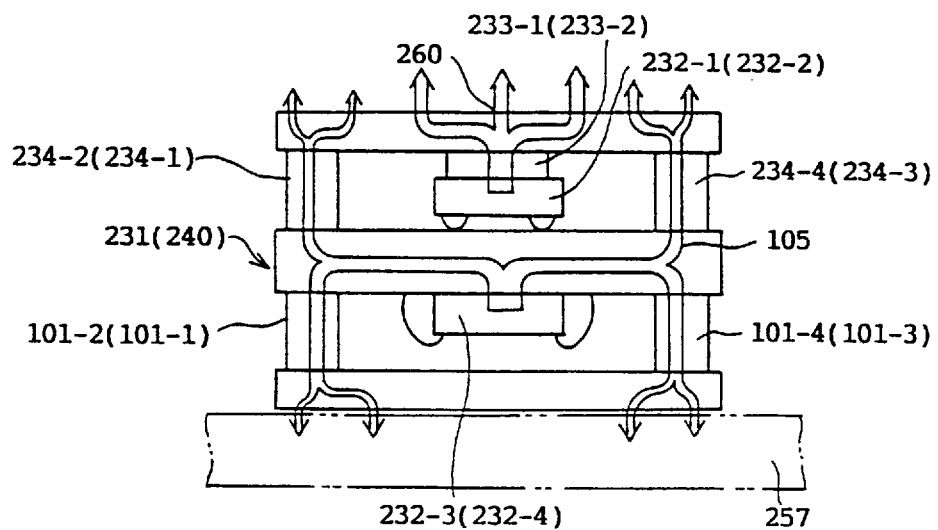
FIG. 23 is a schematic view showing how the heat generated in the multi-chip module of FIG. 22 is radiated.

FIGS. 22 and 23 show a multi-chip module 300 according to the sixth embodiment.

The multi-chip module 300 is generally derived from a combination of the multi-chip module 230 shown in FIGS. 11 and 12 and the multi-chip module 290 shown in FIGS. 19 and 20.

In FIGS. 22 and 23, those components that correspond to the components shown in FIGS. 11, 12, 19 and 20 are designated by the same reference numerals and the description thereof is omitted.

The chips $232_{-1}$–$232_{-4}$ are mounted in the same manner as in the case of the multi-chip module 230 shown in FIGS. 11 and 12.

The heat radiating passage in the sixth embodiment is the same as the corresponding heat radiating passage in the multi-chip module 230 shown in FIGS. 11 and 12 as far as the portion above the circuit board 231 is concerned. The first heat conductive blocks $233_{-1}$ and $233_{-2}$, the second heat conductive blocks $234_{-1}$ and $234_{-2}$ and the heat sink 236 constitute the heat radiating passage above the circuit board 231.

The heat radiating passage below the circuit board 231 is constituted of fourth heat conductive blocks $101_{-1}$–$101_{-4}$, the heat conductive plate 295 and the motherboard 257.

The fourth heat conductive blocks $101_{-1}$–$101_{-4}$ are columnar in shape like the second heat conductive blocks $234_{-1}$–$234_{-4}$. The fourth heat conductive blocks $101_{-1}$–$101_{-4}$ are attached by the silver paste 147 to respective positions in the underside of the base board 240 which positions correspond to the second heat conductive blocks $234_{-1}$–$234_{-4}$.

The fourth heat conductive blocks $101_{-1}$–$101_{-4}$ have lapped lower major surfaces $102_{-1}$–$102_{-4}$, respectively. The lapped lower major surfaces $102_{-1}$–$102_{-4}$ are exposed in the lapped lower major surface 292 of the resin package 235.

The heat conductive plate 295 is attached to the lower major surface 292 by the silicone resin adhesive 255 and in close contact with the lower major surfaces $102_{-1}$–$102_{-4}$ of the fourth heat conductive blocks $101_{-1}$–$101_{-4}$.

The multi-chip module 300 is constructed as described above.

The multi-chip module 300 is produced by a method similar to the method for producing the multi-chip module 230 of the third embodiment and to the method for producing the multi-chip module 290 of the fifth embodiment.

The multi-chip module 300 is mounted on the motherboard 257 such that the leads 237 are soldered to the pads on the motherboard 257 and the heat conductive plate 295 is attached to the motherboard 257 by the silicone resin adhesive 255.

FIG. 23 shows how the heat is radiated while the multi-chip module 300 is operating.

A description will first be given of how the heat generated by the CPU chip $232_{-1}$ and the CMU chip $232_{-2}$ mounted on the upper major surface 231a of the circuit board 231 is radiated.

As indicated by the arrow 260, similarly to the third embodiment described above, the heat generated within the CPU chip $232_{-1}$ and the CMU chip $232_{-2}$ is transferred to the heat sink 236 via the heat conductive blocks $233_{-1}$ and $233_{-2}$ to be radiated to the surrounding atmosphere via the radiating fins 256.

A description will now be given of how the heat generated by the SRAM chips $232_{-3}$ and $232_{-4}$ mounted on the lower major surface 231b of the circuit board 231 is radiated.

As indicated by an arrow 105, the heat generated by the SRAM chips $232_{-3}$ and $232_{-4}$ is transferred to the ceramic base board 240 and spread therein. The heat then diverges at the corners of the ceramic base board 240 to be transferred to the second heat conductive blocks $234_{-1}$–$234_{-4}$ and to the fourth heat conductive blocks $101_{-1}$–$101_{-4}$.

The heat that enters the second heat conductive blocks $234_{-1}$–$234_{-4}$ is transferred upward therein. The heat is finally transferred to the heat sink 236 and radiated to the surrounding atmosphere via the radiating fins 256 exposed to the cooling wind.

The heat that enters the fourth heat conductive blocks $101_{-1}$–$101_{-4}$ is transferred downward therein to reach the heat conductive plate 295 and spread therein.

The heat is then transferred to the motherboard 257, spread therein and is radiated to the surrounding atmosphere via the surface of the motherboard 257.

A description will now be given of a seventh embodiment of the present invention.

Figure 24:
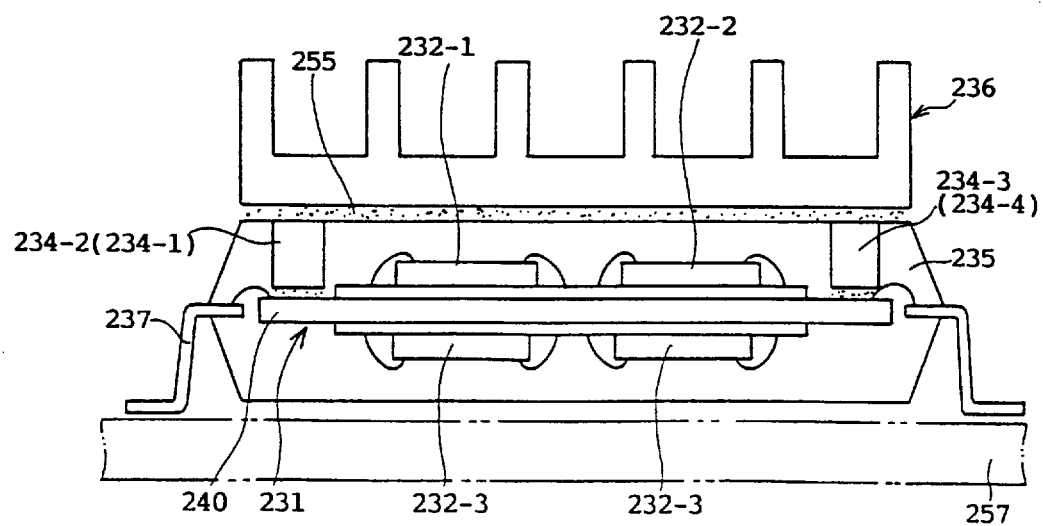
FIG. 24 is a cross-sectional view of a multi-chip module according to a seventh embodiment of the present invention.

FIG. 24 shows a multi-chip module 310 according to the seventh embodiment.

The multi-chip module 310 is based on the multi-chip module 230 shown in FIGS. 11 and 12, the difference being that the CPU chip $232_{-1}$ and the CMU chip $232_{-2}$ are die-bonded.

Since the CPU chip $232_{-1}$ and the CMU chip $232_{-2}$ are die-bonded and wire-bonded, the first heat conductive blocks $233_{-1}$ and $233_{-2}$ shown in FIGS. 11 and 12 are not provided.

In FIG. 24, those components that correspond to the components shown in FIG. 12 are designated by the same reference numerals and the description thereof is omitted.

Figure 25:
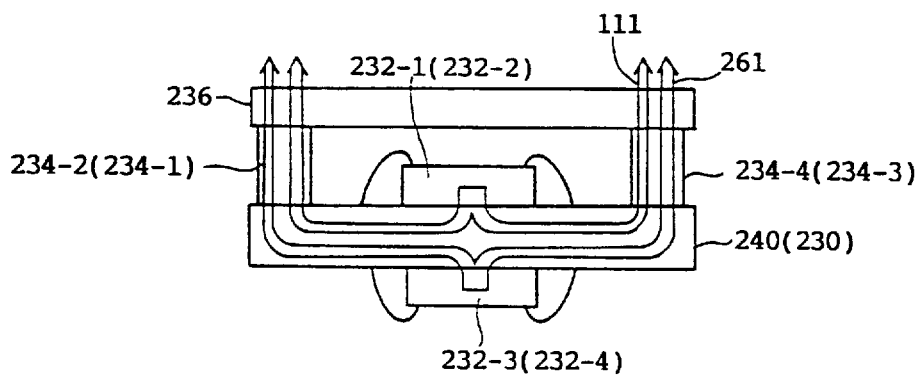
FIG. 25, is a schematic view showing how the heat generated in the multi-chip module of FIG. 24 is radiated.

FIG. 25 shows how the heat is radiated while the multi-chip module 310 is operating.

A description will first be given of how the heat generated by the CPU chip $232_{-1}$ and the CMU chip $232_{-2}$ mounted on the upper major surface 231a of the circuit board 231 is radiated.

The heat generated within the CPU chip $232_{-1}$ and the CMU chip $232_{-2}$ is transferred as indicated by an arrow 111.

Specifically, the heat generated within the CPU chip $232_{-1}$ and the CMU chip $232_{-2}$ is transferred to the ceramic base board 240 and spread therein. The heat is then transferred to the second heat conductive blocks $234_{-1}$–$234_{-4}$ at the corners of the ceramic base board 240 and drifts upward in the second heat conductive blocks $234_{-1}$–$234_{-4}$. Finally, the heat is transferred to the heat sink 236 and radiated to the surrounding atmosphere via the radiating fins 256 exposed to the cooling wind.

A description will now be given of how the heat generated by the SRAM chips $232_{-3}$ and $232_{-4}$ mounted on the lower major surface 231b of the circuit board 231 is radiated.

The heat generated within the SRAM chips $232_{-3}$ and $232_{-4}$ is transferred as indicated by the arrow 261.

Specifically, the heat generated within the SRAM chip $232_{-3}$ and $232_{-4}$ is also transferred to the ceramic base board 240 and spread therein. The heat is then transferred to the second heat conductive blocks $234_{-1}$–$234_{-4}$ at the corners of the ceramic base board 240 and drifts upward in the second heat conductive blocks $234_{-1}$–$234_{-4}$. Finally, the heat is transferred to the heat sink 236 and radiated to the surrounding atmosphere via the radiating fins 256 exposed to the cooling wind.

The present invention is not limited to the above described embodiments, and variations and modifications may be made without departing from the scope of the present invention. Particularly, the arrangement of the chips $232_{-1}$–$232_{-4}$ is not limited to the one described in the embodiments.

What is claimed is:

1. A semiconductor device comprising:
    a ceramic base board having high heat conductivity;
    an upper group of semiconductor chips mounted on the upper major surface of said ceramic base board by flip-chip bonding;
    heat conductive blocks of a first type which, formed of a material having high heat conductivity, are attached to said upper group of semiconductor chips;
    heat conductive blocks of a second type which, formed of a material having high heat conductivity, are attached to the upper major surface of said ceramic base board;
    a lower group of semiconductor chips mounted on the lower major surface of said ceramic base board by die-bonding;
    a resin package for encapsulating said ceramic base board, said upper group of semiconductor chips, said heat conductive blocks of a first type, said heat conductive blocks of a second type and said lower group of semiconductor chips;
    leads which extend from said resin package and are bonded to a circuit board when the semiconductor device is mounted on the circuit board; and
    a heat sink attached to the upper major surface of said resin package after lapping the upper major surface of said resin package so as to expose said heat conductive blocks of a first type and said heat conductive blocks of a second type.

2. The semiconductor device as claimed in claim 1, wherein the heat conductive blocks of a second type are columns attached near the corners of said ceramic base board.

3. The semiconductor device as claimed in claim 2, wherein the heat conductive blocks of a second type are blocks having a rectangular cross section attached to said ceramic base board so as to surround said upper group of semiconductor chips.

4. A semiconductor device comprising:
    a ceramic base board having high heat conductivity;
    an upper group of semiconductor chips mounted on the upper major surface of said ceramic base board by flip-chip bonding;
    heat conductive blocks of a first type which, formed of a material having high heat conductivity, are attached to said upper group of semiconductor chips;

a lower group of semiconductor chips mounted on the lower major surface of said ceramic base board by flip-chip bonding;

heat conductive blocks of a second type which, formed of a material having high heat conductivity, are attached to said lower group of semiconductor chips on said lower major surface of said ceramic board;

a resin package for encapsulating said ceramic base board, said upper group of semiconductor chips, said heat conductive blocks of a first type, said lower group of semiconductor chips and said heat conductive blocks of a second type;

leads which extend from said resin package and are bonded to a circuit board when the semiconductor device is mounted on the circuit board;

a heat sink attached to the upper major surface of said resin package after lapping the upper major surface of said resin package so as to expose said heat conductive blocks of a first type; and a heat conductive plate attached to the lower major surface of said resin package after said heat conductive blocks of a second type are exposed by lapping the lower major surface of said resin package, the heat conductive plate being bonded to a circuit board when the semiconductor device is mounted on the circuit board.

5. A semiconductor device comprising:

a ceramic base board having high heat conductivity;

an upper group of semiconductor chips mounted on the upper major surface of said ceramic base board by flip-chip bonding;

heat conductive blocks of a first type which, formed of a material having high heat conductivity, are attached to said upper group of semiconductor chips;

heat conductive blocks of a second type which, formed of a material having high heat conductivity, are attached to the upper major surface of said ceramic base board;

a lower group of semiconductor chips mounted on the lower major surface of said ceramic base board by die-bonding;

heat conductive blocks of a third type which, formed of a material having high heat conductivity, are attached to the lower major surface of said ceramic base board;

a resin package of encapsulating said ceramic base board, said upper group of semiconductor chips, said heat conductive blocks of a first type, said heat conductive blocks of a second type; said lower group of semiconductor chips and said heat conductive blocks of a third type;

leads which extend from said resin package and are bonded to a circuit board when the semiconductor device is mounted on the circuit board;

a heat sink attached to the upper major surface of said resin package after lapping the upper major surface of said resin package so as to expose said heat conductive blocks of a first type and said heat conductive blocks of a second type; and a heat conductive plate attached to the lower major surface of said resin package after said heat conductive blocks of a third type are exposed by lapping the lower major surface of said resin package, the heat conductive plate being bonded to a circuit board when the semiconductor device is mounted on the circuit board.

6. A semiconductor device comprising:

a ceramic base board having high heat conductivity;

an upper group of semiconductor chips mounted on the upper major surface of said ceramic base board by flip-chip bonding;

heat conductive blocks which, formed of a material having high heat conductivity, are attached to the upper major surface of said ceramic base board;

a lower group of semiconductor chips mounted on the lower major surface of said ceramic base board by die-bonding;

a resin package for encapsulating said ceramic base board, said upper group of semiconductor chips, said heat conductive blocks and said lower group of semiconductor chips;

leads which extend from said resin package and are bonded to a circuit board when the semiconductor device is mounted on the circuit board; and a heat sink attached to the upper major surface of said resin package after lapping the upper major surface of said resin package so as to expose said heat conductive blocks.

* * * * *